United States Patent
Chen et al.

(10) Patent No.: US 8,828,821 B2
(45) Date of Patent: Sep. 9, 2014

(54) FABRICATION OF SEMICONDUCTOR STACKS WITH RUTHENIUM-BASED MATERIALS

(75) Inventors: Hanhong Chen, Milpitas, CA (US); Nobumichi Fuchigami, Sunnyvale, CA (US); Imran Hashim, Saratoga, CA (US); Pragati Kumar, Santa Clara, CA (US); Sandra Malhotra, San Jose, CA (US); Sunil Shanker, Santa Clara, CA (US)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 156 days.

(21) Appl. No.: 13/395,071

(22) PCT Filed: Sep. 18, 2009

(86) PCT No.: PCT/US2009/057371
§ 371 (c)(1),
(2), (4) Date: Mar. 8, 2012

(87) PCT Pub. No.: WO2011/034536
PCT Pub. Date: Mar. 24, 2011

(65) Prior Publication Data
US 2012/0171839 A1    Jul. 5, 2012

(51) Int. Cl.
| | |
|---|---|
| *H01L 21/8242* | (2006.01) |
| *H01L 21/02* | (2006.01) |
| *C23C 16/455* | (2006.01) |
| *C23C 16/02* | (2006.01) |
| *H01L 27/108* | (2006.01) |
| *H01L 49/02* | (2006.01) |
| *C23C 16/40* | (2006.01) |

(52) U.S. Cl.
CPC ...... *C23C 16/45531* (2013.01); *H01L 21/0228* (2013.01); *C23C 16/0281* (2013.01); *C23C 16/0272* (2013.01); *H01L 27/10852* (2013.01); *H01L 28/75* (2013.01); *C23C 16/405* (2013.01); *H01L 28/65* (2013.01); *H01L 21/02197* (2013.01); *H01L 21/02186* (2013.01); *H01L 21/02194* (2013.01); *H01L 21/02304* (2013.01); *H01L 28/40* (2013.01)
USPC ........... 438/253; 438/238; 438/239; 438/240; 438/396

(58) Field of Classification Search
USPC .................. 438/238–240, 253, 396
See application file for complete search history.

(56) References Cited

U.S. PATENT DOCUMENTS

| | | | | |
|---|---|---|---|---|
| 6,475,854 | B2 * | 11/2002 | Narwankar et al. | 438/238 |
| 7,611,912 | B2 * | 11/2009 | Hong et al. | 438/3 |
| 8,003,462 | B2 * | 8/2011 | Nakabayashi | 438/240 |
| 8,318,572 | B1 * | 11/2012 | Shanker et al. | 438/381 |

(Continued)

*Primary Examiner* — Bac Au

(57) ABSTRACT

This disclosure provides a method of fabricating a semiconductor stack and associated device such as a capacitor and DRAM cell. In particular, a bottom electrode upon which a dielectric layer is to be grown may have a ruthenium-based surface. Lattice matching of the ruthenium surface with the dielectric layer (e.g., titanium oxide, strontium titanate or barium strontium titanate) helps promote the growth of rutile-phase titanium oxide, thereby leading to higher dielectric constant and lower effective oxide thickness. The ruthenium-based material also provides a high work function material, leading to lower leakage. To mitigate nucleation delay associated with the use of ruthenium, an adherence or glue layer based in titanium may be employed. A pretreatment process may be further employed so as to increase effective capacitor plate area, and thus promote even further improvements in dielectric constant and effective oxide thickness ("EOT").

14 Claims, 8 Drawing Sheets

(56) References Cited

U.S. PATENT DOCUMENTS

| | | | |
|---|---|---|---|
| 8,349,696 B1 * | 1/2013 | Chen et al. | 438/393 |
| 8,415,657 B2 * | 4/2013 | Rui et al. | 257/15 |
| 8,470,665 B2 * | 6/2013 | Yang | 438/238 |
| 8,551,809 B2 * | 10/2013 | Kumar et al. | 438/104 |
| 2008/0272490 A1 * | 11/2008 | Kim et al. | 257/751 |
| 2009/0272962 A1 * | 11/2009 | Kumar et al. | 257/4 |
| 2011/0096595 A1 * | 4/2011 | Terai | 365/163 |

* cited by examiner

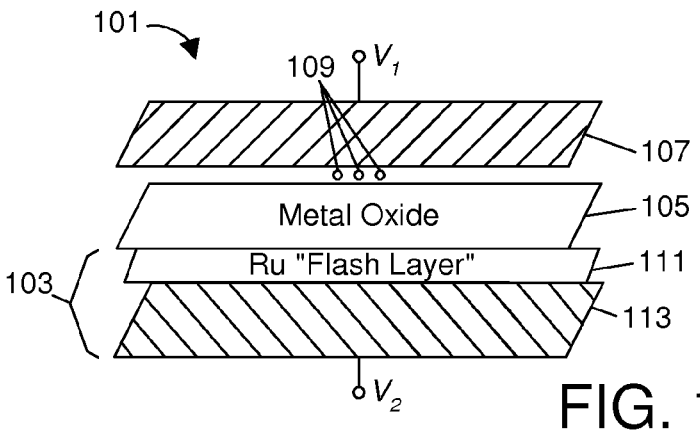
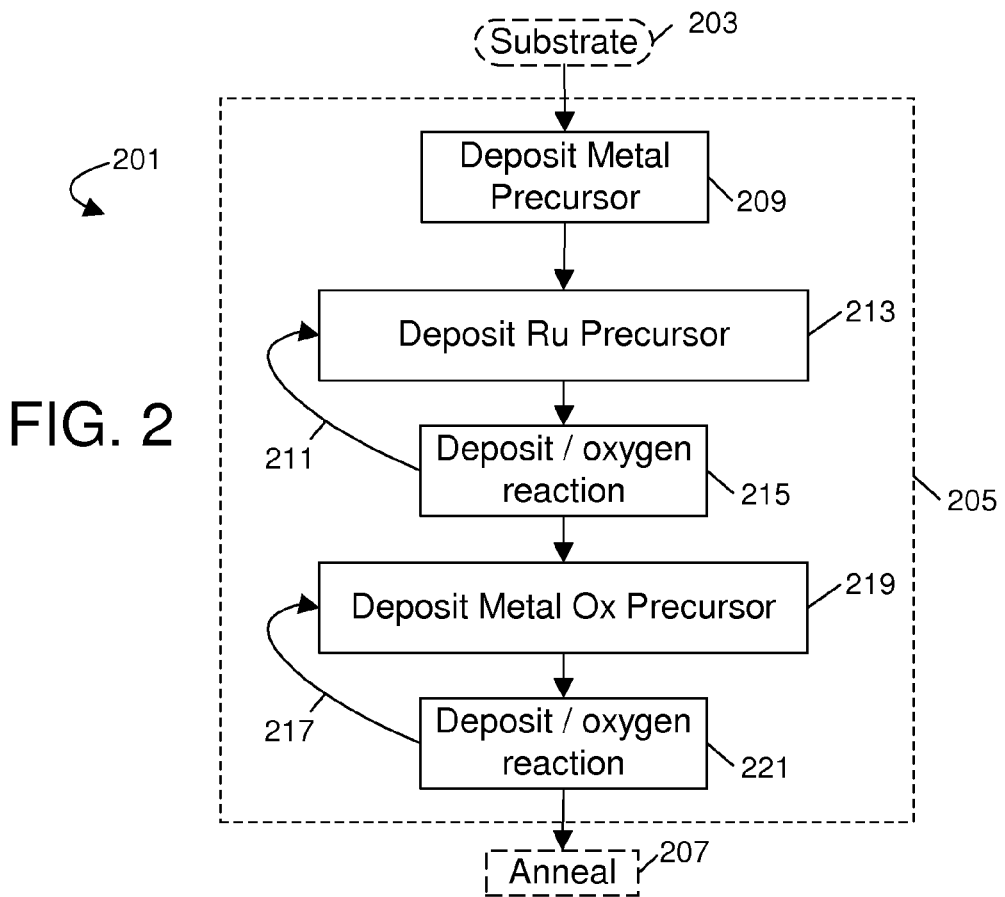
FIG. 1
FIG. 2

FABRICATION OF SEMICONDUCTOR STACKS WITH RUTHENIUM-BASED MATERIALS

BACKGROUND

To fuel a continued trend toward further miniaturization, the electronics industry continues to research materials having a lower effective oxide thickness ("EOT") and lower leakage. These materials potentially enable thinner and smaller area capacitors and other high-K devices used en masse in many modern circuit designs (e.g., memory arrays). Generally, the higher "K-value" (i.e., dielectric constant) a material provides, the lower the obtainable EOT. However, as dielectric layers become thinner, leakage increases, thereby inhibiting further effective miniaturization. Industry has therefore sought alternative designs to alleviate this bottleneck.

High work function metals such as platinum and ruthenium can reduce leakage, and thus are promising candidates for use as electrodes in combination with high K-value materials. However, these metals are generally much more expensive than the more common electrode materials such as titanium nitride. In addition, ruthenium in particular usually presents a strong nucleation delay issue, which further increases cost (both in terms of lost productivity and precursor cost). To elaborate on this issue, semiconductor deposition processes sometimes call for depositing a metal or metal oxide on patterned surfaces, with the desired result that the material is adhered to different types of surface geometries or substances (such as a silicon substrate or another material). Conventional ruthenium processes may present nucleation delay issues, especially where silicon or silicon oxide is involved, meaning that time and materials may be wasted in ruthenium processes, which further complicates the expense issue.

What is needed is a semiconductor stack and related method of manufacture that addresses the aforementioned problems. The present invention satisfies these needs and provides further, related advantages.

DETAILED DESCRIPTION

FIG. 1 is an illustrative diagram that shows a metal-insulator-metal ("MIM") stack 101, configured as a capacitor. The depicted stack includes a bottom electrode 103, a metal oxide layer 105 and a top electrode 107. The stack depicted in FIG. 1 uses a ruthenium-based material layer 111 as a conductor, in effect forming a part of the bottom electrode, to help promote better dielectric constant (and thus, better EOT). The bottom electrode may also be made entirely of ruthenium, but in this example, is primarily made of a relatively inexpensive base electrode material 113 such as titanium nitride (TiN) and the ruthenium layer 111 may in this example be thought of as a "capping layer" or "flash layer," to provide electrode surface characteristics consistent with ruthenium (and ruthenium oxide in particular).

FIG. 2 presents a block diagram 201 used to illustrate a process of fabricating at least part of the MIM stack of FIG. 1. In particular, one to several layers of a metal precursor is used to form a "glue layer" to help reduce nucleation delay and promote adherence of the ruthenium-based material layer to both any underlying electrode base layer as well as any exposed substrate material (e.g., silicon), upon which the underlying electrode base layer has been patterned. The metal precursor may be the same precursor used to fabricate the metal oxide layer used as the capacitor dielectric; in several embodiments below, a titanium-containing precursor is used.

FIG. 3 is a cross-sectional view of a multi-layer stack 301 which has been fabricated upon a silicon oxide substrate 303. In particular, an electrode base layer 305 may be thought of as extending into and out of the page in this example, with a ruthenium-based capping layer 307 deposited above both the electrode and the substrate. A titanium precursor, in this case, an amide-containing titanium precursor, is deposited as a conformal monolayer 309 to promote adherence/nucleation of the ruthenium-based material layer to the substrate. A metal oxide layer such as a doped titanium oxide is deposited over the ruthenium-based material layer, and other materials including a second electrode may then be added as appropriate.

FIG. 4 provides a flow chart 401 used to explain fabrication of a layer stack for use as a capacitor. The embodiment of FIG. 4 uses an optional process 421 to increase surface roughness of one of the electrode/metal oxide interfaces, so as to increase effective dielectric constant (and thus decrease EOT) of the layer stack. Metal oxide layer options for the dielectric material in this example include titanium oxide, strontium titanate and barium strontium titanate.

FIG. 5 provides a graph 501 of leakage density (vertical axis) and EOT (horizontal axis) for a MIM stack having a titanium oxide dielectric doped with yttrium as a function of whether ruthenium-based or platinum-based electrodes are used. Solid line and dotted line trend indicators 503 and 505 indicate that significantly lower EOT can be obtained where a ruthenium-based material is used for at least the surface of the bottom electrode. The lower EOT is believed to be a result of lattice-matching between titanium oxide (rutile) and oxidized ruthenium; otherwise stated, it is believed that the use of ruthenium via a process where titanium metal is reactively transferred above an oxidized ruthenium layer helps constrain titanium oxide formation to rutile-phase, while suppressing formation of anatase-phase titanium oxide. It is believed that the yttrium doping helps lower leakage, with generally good results for all samples (e.g., leakage of less than $10^{-7}$ Amps per square centimeter, measured at 1 Volt). Other dopants such as oxides of aluminum, scandium and strontium may also be used.

FIG. 6 provides a plot 601 similar to FIG. 5, but that compares different fabrication processes for yttrium doping of titanium oxide. In particular, a first (solid) trend line 603 represents yttrium doping through an ALD process, where a thin layer of yttrium precursor is applied to conformally coat an exposed substrate to approximately atomic-scale thickness; a second (dotted) trend line 605 represents 8 and 20% yttrium dopings, that is, where a distinct layer of yttrium oxide is formed on or transferred to a substrate prior to resumption of a titanium oxide deposition process.

FIG. 7 presents a plot 701 of deposition rate associated with nucleation delay between ruthenium and a silicon oxide substrate. In particular, as indicated by a first (solid) line 703 where ruthenium precursor (ruthenocene) is used alone, nucleation delay was seen to result in a deposition rate of substantially "zero" through 500 ALD cycles. By contrast, where a thin layer of titanium precursor is used to pretreat the substrate, prior to the use of ruthenocene, the nucleation delay is substantially eliminated, and a deposition rate of approximately ⅓ Angstrom per cycle is observed, indicated by a second (dashed) line 705. FIG. 7 helps demonstrate that the use of a titanium precursor may significantly impact nucleation delay if used between a silicon or similar substrate and a layer of ruthenium.

FIG. 8 is a plot of leakage and dielectric constant (K-value) as a function of electrode surface roughness. In particular, by ensuring an "appropriately rough" electrode surface, such as by post-deposition roughening of the ruthenium-based material's surface, one may increase the effective capacitor plate area and thus increase effective MIM stack capacitance (assuming otherwise fixed capacitor length and width dimensions). A first (dashed) line 803 plots leakage for the samples, while a second (solid) line 805 plots dielectric constant; a vertical guide line 807 represents the position where leakage rises above approximately $10^{-6}$ Amps per square centimeter, measured at 1 Volt. It is believed that effective dielectric constant increases in a manner generally proportional to surface roughness, but at the expense of increased leakage; what FIG. 8 helps show is that roughness developed using an ozone scrubbing process described herein should be kept below approximately 3 nanometers, given materials and processes used, to ensure leakage above $10^{-6}$ Amps per square centimeter, measured at 1 Volt.

FIG. 9 presents a graph 901 used to assess the impact of pretreatment on leakage and EOT characteristics.

FIG. 10 is a flow chart of an embodiment that illustrates use of an ALD process to create an oxide layer using a number of ALD deposition cycles. In some embodiments, these monolayers may be configured as individual depositions each involving titanium oxide; in other embodiments, certain ones of these monolayers may include dopants, such as for example, providing a nanolaminate of yttrium oxide ($Y_2O_3$), aluminum oxide ($Al_2O_3$) or an oxide of strontium or scandium interspersed between layers of titanium oxide ($TiO_2$).

FIG. 11 is an illustrative diagram showing the layout of a vacuum chamber used in an ALD process.

FIG. 12 shows a graph 1201 that plots leakage and EOT for tetrakis isopropoxide (TTIP), a non-amide titanium precursor, as well as for two amide-containing precursors, namely, tetrakis dimethylamino titanium ("TDMAT") and tetrakis (ethylmethylamino) titanium ("TEMAT"). Data for each of the two groups of precursors are fairly well separated, with a first ellipse 1203 identifying data associated with TTIP and a second ellipse 1205 identifying data associated with the amide-containing precursors. In particular, each of the precursors is seen to yield similar EOT characteristics, with the amide-containing precursors producing significantly lower leakage.

FIG. 13 presents a graph 1301 of deposition rate where TDMAT, TEMAT and TTIP are used as titanium precursors. What FIG. 13 indicates is the amide-containing precursors (TDMAT and TEMAT) produces significantly better (nearly five-fold) deposition rate improvement relative to the TTIP data, leading to significantly faster dielectric formation time and, ultimately, lower manufacturing costs.

FIG. 14 is a diagram that plots leakage density and EOT for various percentages of yttrium to total metal. FIG. 14 indicates that the yttrium contribution for Y—Ti—$O_x$ films that provide good leakage density and EOT in an ALD process range from about one to five percent, with excellent results obtained for approximately 1-2% yttrium contribution to total metal.

FIG. 15 shows a cross-section of a capacitive device having two conductors 1503 and 1505 and a dielectric layer 1504. FIG. 3 illustrates that the dielectric layer can be formed of a number of discrete monolayers (1507, 1509, 1511, 1513 and 1515), each deposited by an atomic layer deposition (ALD) or other process. Each of these layers can have titanium oxide such as layers 1507, 1511, 1513 and 1515 and, if desired, an occasional layer (layer 1513) can be optionally made to have a dopant, for example, yttrium oxide, scandium oxide, strontium oxide or aluminum oxide.

FIG. 16 provides a graph 1601 of deposition rate as a function of temperature in an ALD process; each of two curves represents use of a different precursor (e.g., a first titanium precursor 1603 and a second titanium precursor or a dopant precursor 1605). The horizontal area of each curve represents an ALD process window.

FIG. 17 charts correlation between leakage and roughness, each as a function of RTO temperature for a device having a ruthenium bottom electrode.

Figure 20:
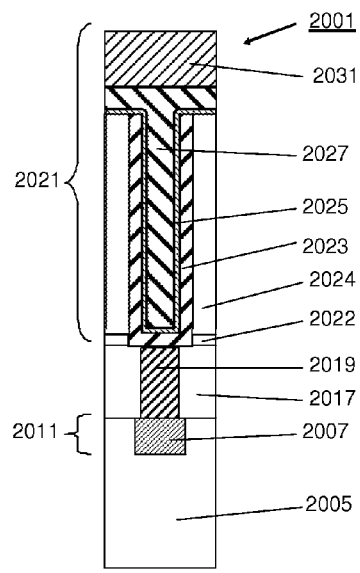
Figure 21:
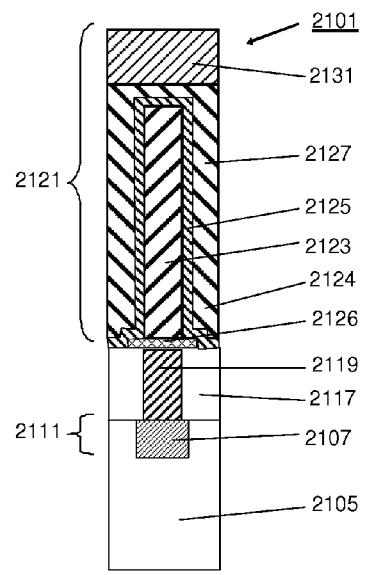
Figure 22:
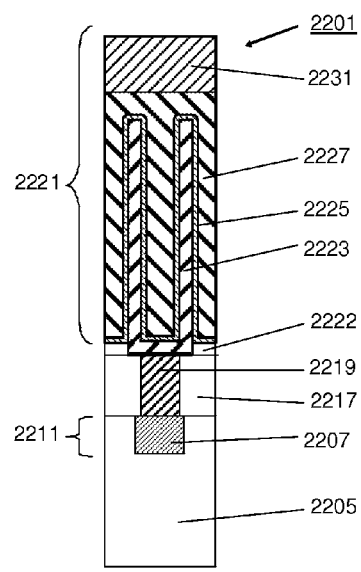

FIGS. 20-22 respectively illustrate memory cells including different capacitor configurations.

FIG. 20, in particular, illustrates a memory cell 2001 including a cylinder-shaped capacitor 2021.

FIG. 21 illustrates a memory cell 2101 using a pillar- or pedestal-shaped capacitor 2121.

FIG. 22 illustrates a memory cell 2201 using a crown-shaped capacitor 2221.

DETAILED DESCRIPTION

The invention defined by the enumerated claims may be better understood by referring to the following detailed description, which should be read in conjunction with the accompanying drawings. This description of one or more particular embodiments, set out below to enable one to build and use various implementations of the invention or inventions set forth by the claims, is not intended to limit the enumerated claims, but to exemplify their application to certain methods and devices. The description set out below exemplifies (i) a method of forming at least part of an electronic device stack, namely, one having a metal oxide layer, a conductive layer or layers operative as an electrode, where at least part of the electrode includes a ruthenium-based layer, and where an "adherence" or "glue" layer is used to reduce nucleation delay, and (ii) a semiconductor stack, for example, employed as a capacitor, a DRAM cell, or similar structure. The invention, however, may also be applied to other methods and devices as well.

I. Introduction.

One embodiment of the present invention provides a semiconductor stack, having an electrode mounted above a silicon-based substrate, a ruthenium-based material layer (e.g., used as a capping layer above an electrode, or where the electrode is substantially composed of a ruthenium-based material), and a metal oxide layer above the ruthenium-based material layer. The ruthenium-based material layer is deposited using an adherence layer to interface ruthenium-based material with at least some areas of silicon-based substrate. In more specific embodiments, the adherence layer can take the form of a thin monolayer of a metal oxide. In one example, the adherence layer can be fabricated using metal precursor, for example, as a very thin titanium or titanium oxide layer. In still more particular embodiments, a metal precursor can be used which is of a type having a common metal with a primary metal used for the metal oxide layer (i.e., the primary dielectric layer); for example, if the dielectric layer is primarily titanium oxide, then a titanium precursor may be used as the adherence layer. It has been found that use of a precursor-based adherence material helps substantially reduce nucleation delay and thus permits the use of ruthenium to form at least part of the electrode structure. Ruthenium precursor is relatively expensive for semiconductor fabrication processes and, so, an inexpensive conductor (e.g., such as titanium nitride, or TiN) can be used to form the bulk of an electrode, with ruthenium-based material used to cap the electrode, to provide a "flash" or "capping" layer and, thus, make sparing use of the relatively expensive materials.

In one embodiment that uses an inexpensive base electrode layer, the ruthenium-based material layer can be made relatively thin (e.g., less than fifty Angstroms in thickness) with the inexpensive conductor being at least this thick (such that the ruthenium-based material layer makes up less than fifty percent of overall electrode thickness); in yet another embodiment, the inexpensive electrode may be made several times as thick as the ruthenium-based material layer (such that the ruthenium-based material layer makes up less than twenty percent of overall electrode thickness).

Irrespective of whether an inexpensive base electrode material is used, exposed ruthenium, if desired, can be oxidized to provide for an exposed conductor surface made of ruthenium oxide. Where a metal oxide layer of titanium oxide is grown above this surface (e.g., using an ALD process), the presence of the ruthenium oxide promotes the growth of rutile-phase titanium oxide, which has high and desirable dielectric constant. Thus, the presence of the ruthenium-based material helps promote a device stack having excellent dielectric constant; because ruthenium is a very high work function material, this device also presents relatively low leakage characteristics, and thus facilitates the trend toward increased miniaturization alluded to earlier.

In still other embodiments, the assembly introduced above can include a second electrode layer (which may or may not include the same materials used for the first electrode layer) to serve as a top electrode; such an assembly may be employed as a capacitor or for more complicated circuits, such as a dynamic random access memory ("DRAM") cell, an array of such cells, or other electronic circuits.

In yet another variation, the ruthenium-based material layer (electrode or portion of electrode, such as a capping layer) may be deliberately "roughened" to increase electrode surface area by introducing deformities, so as to effectively increase effective capacitance. That is to say, as will be discussed below, exposed ruthenium-based material may be subjected to a surface treatment process that effectively scratches (i.e., roughens) the exposed material so as to increase its effective surface area. By increasing the effective surface area of a relatively thin metal layer (e.g., a ruthenium-based capping layer), capacitor plate surface area may be increased without using hemispherical polysilicon or related etch processes. See, e.g., U.S. Pat. No. 6,794,245 to Zheng. Further below, processes will be introduced for building cylinder-, pillar- and crown-shaped structures using this process.

The invention also provides a method of building at least part of a semiconductor stack. In particular, one embodiment of the invention calls for fabricating a layer of a titanium precursor above a substrate, fabricating a ruthenium-based material layer above the thin conformal layer of titanium precursor, such that an adherence or glue layer made using the titanium precursor is between the ruthenium-based material layer and the substrate, and fabricating a metal oxide layer (i.e., dielectric layer) to lie above the ruthenium-based material layer. The method may be used with or without a base electrode layer, for example, formed of a relatively inexpensive electrode material such as titanium nitride. The adherence (or glue) layer, once formed, has a composition that includes titanium, oxygen, carbon and nitrogen (or other precursor byproducts, as appropriate), and is typically less than 10 Angstroms in thickness; in one embodiment, the glue layer may be less than 3-5 Angstroms in thickness.

FIG. 1 shows a metal-insulator-metal ("MIM") structure 101, configured as a capacitor. The structure includes two electrodes 103 and 107 having a metal oxide layer therebetween to serve as a capacitor dielectric. The metal oxide layer may consist of a number of individual monolayers, and the structure may include other layers as appropriate or desired for the particular design (as generally represented by ellipses 109)—such additional layers may lie above or below the metal oxide layer 105. As indicated by numeral 111, a ruthenium-based capping or flash layer structure may also be employed to permit sparing use of ruthenium coupled with use of a less expensive base electrode layer (e.g., indicated by numeral 113). It should be appreciated that the ruthenium-based flash layer 111 and associated base electrode layer together operate as one conductive electrode and that, if desired, a single electrode layer consisting entirely of ruthenium or a more complicated configuration of layers may also be employed; the operative principle illustrated in FIG. 1 is that the ruthenium-based material layer 111 interfaces with the metal oxide layer 105 in a manner that contributes to desirable electronic properties for the structure 101. For example, as was indicated above, the ruthenium layer may be used to promote the growth of rutile-phase titanium oxide (at the expense of anatase-phase or amorphous titanium oxide). As indicated above, if a capping layer is used, it may be configured to be less than 20-50% of overall electrode thickness, thus conserving expensive ruthenium precursor. Finally, as also indicated by FIG. 1, each electrode may be electronically coupled to a potential ($V_1$ or $V_2$), thus permitting the structure to be operated as a capacitor.

Notably, the term "MIM" as used herein should be understood to encompass any combination of layers that utilize a dielectric with two electrodes, whether or not additional layers are present; for example, the term "MIM" should be understood to encompass metal-insulator-insulator-metal, metal-insulator-insulator-insulator-metal, metal-insulator-metal-insulator-metal and other, similar structures, with or without further insulators, enhancement layers, smoothing or adherence layers or other structures between them. An oxide "layer" should be understood to refer to either (a) the entire dielectric layer, which may consist of a single layer or one or more "monolayers" that together cooperate to form the dielectric layer, as well as (b) individual monolayers layers, e.g., an oxide of titanium, yttrium/aluminum, or both. Thus, a "layer" may refer to a single layer, to an aggregate combination of layers, or to one monolayer. The term "nanolayer" refers to a thin deposition that may achieve sparse or complete layer coverage—for example, a single ALD cycle may be used to deposit a nanolayer. The "substrate" may be any material capable of supporting a layer of semiconductor material, and may include a metal conductor, insulator, glass, previously deposited layer (dielectric, or otherwise) or another material, but generally in this disclosure will refer to a metal electrode mounted above a $SiO_2$ or other base. "Preparation," "treatment" or "pretreatment" of a layer typically includes cleaning or oxidizing a substrate to promote good adhesion between a to-be-deposited layer and the substrate, and to otherwise ready the substrate's surface for a semiconductor deposition; in the context of the discussion below, this term is also used to encompass scrubbing under pressure to render the surface somewhat abrasive, i.e., to scratch or roughen the surface. It should also generally be noted that when the term "ozone" is used in this disclosure, it is being used not to necessarily require "pure, 100%" ozone—that is, generally speaking, ozone is typically not used in pure form, i.e., it is typically mixed with other gasses such as oxygen in an approximately 1/5 ratio, and that such a mixture is typically the instantiation of "ozone" in the specific processes advanced by this disclosure. Finally, the terms "ruthenium" and "ruthenium-based" should be understood to used to both encompass use of pure ruthenium as well as materials having a substantial ruthenium constituency, including ruthenium oxide (doped or undoped), and usage of these materials diluted by other materials and compounds.

FIG. 2 provides a flow chart 201 used to help explain a method of fabricating at least part of a semiconductor stack. Three dashed line objects 203, 205 and 207 are illustrated in FIG. 2, representing different basic components of the method. In particular, as indicated by a starting block 203, one may begin with a substrate (e.g., a silicon substrate that has been patterned to have one or more electrode structures on its surface (e.g., bit lines, word lines, signal lines, or other appropriate). The second object 205 represents a deposition process, in one implementation, an atomic layer deposition ("ALD") process. [ALD refers to a typically multi-cycle process used to deposit conformal layers with atomic scale thickness during semiconductor processing operations. ALD is generally regarded a multi-step, self-limiting process that includes the use of at least one precursor and at least one reagent, with the precursor establishing a thin conformal layer and with an in-situ reaction precipitated by introduction of the reagent terminating once the thin conformal layer is formed; each reaction is one "cycle," with multiple cycles often being used to build a layer of any substantial thickness.] Finally, an anneal may be used as indicated by dashed line block 207, to fill any oxygen deficiencies in the dielectric structure and, in general, to enhance dielectric constant of a metal oxide layer fabricated during the ALD process, or for other purposes. Each of the dashed line blocks contributes to the fabrication of a stack having desirably low-leakage and high dielectric constant characteristics. For example, the ALD process creates a layer that inhibits nucleation delay between the substrate and ruthenium precursor and, as mentioned, the anneal process (i.e., performed at the proper temperature or temperature range) helps enhance dielectric constant.

The ALD process 205 includes a number of steps toward these ends. In particular, a metal precursor may first be deposited over the substrate, as indicated by step 209. It will be recalled that a substrate is any material or combination of materials capable of supporting a semiconductor material layer and, thus, the precursor is typically deposited over at least an area having an exposed base electrode layer (if ruthenium is applied via a capping layer) and potentially some margins adjacent the electrode where exposed silicon or a similar material is present. The metal precursor serves as a "glue" layer or "adherence" layer that helps mitigate nucleation delay between ruthenium and certain substrate materials, especially including those heavy in silicon or a similar material. Thus, the use of the glue or adherence layer helps avoid issues where ruthenium is inconsistently deposited on the electrode surface. In this regard, the glue layer may be fabricated using titanium metal precursor—many precursor materials have one or more exposed methyl groups or other compounds that are removed as part of the ALD process, to leave a bond or bonds suitable for reaction, and it is believed that the use of such a precursor specifically changes the surface chemistry of the underlying substrate in a manner where nucleation delay is no longer a significant issue. If desired, an amide-containing metal precursor may be used such as Ti[N(C$_2$H$_5$CH$_3$)]$_4$ ("TEMAT"), Ti[N(CH$_3$)$_2$]$_4$ ("TDMAT"), or Ti[N(C$_2$H$_5$)$_2$]$_4$ ("TDEAT"). The precursor used for the "glue" layer may be the same precursor as used for dielectric formation if desired to minimize the type of materials used during the deposition process; that is to say, TEMAT, TDMAT or TDEAT may be used to fabricate a dielectric rooted in titanium oxide. Following deposition of the metal precursor over the substrate, a ruthenium-based material layer may then be formed (to either itself act as the electrode or to act as the electrode in combination with an underlying base metal, such as TiN. FIG. 2 indicates a number of ALD cycles of depositing ruthenium precursor (e.g., ruthenocene) and ensuing oxygen source pulses, and repeated ALD cycling (per numerals 211, 213 and 215) until a desired number of layers is built up to form a ruthenium layer of desired thickness. For example, if a ruthenium-based capping layer of twenty Angstroms is to be used, and assuming that each cycle deposits a ruthenium-based layer of 0.33-0.5 Angstroms, 40-66 ALD cycles may be necessary. As mentioned previously, the use of ruthenium (and ruthenium oxide in particular) provides a lattice structure that is complementary to rutile-phase titanium oxide, and thus helps engender desirable dielectric constant and EOT characteristics as the dielectric layer is "grown." Finally, a metal oxide layer is then added to serve as a stack dielectric, via a similar, repeated ALD cycle sequence of precursor and reaction, per numerals 217, 219 and 221.

Figure 3:
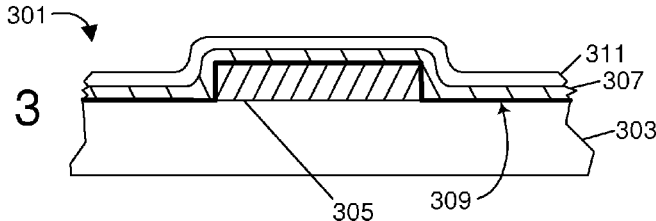

FIG. 3 illustrates a structure 301 formed by the method of FIG. 2. [As with the other FIGS. presented in this disclosure, thicknesses in FIG. 3 are not drawn to scale and should not be construed as an indication that one layer should be relatively thicker or thinner than any other layer.] In particular, a substrate may consist of a silicon base 303 overlaid by a patterned base electrode 305. The pattern can be that of a cylinder, crown, pedestal, or any other DRAM electrode structure (see e.g. FIGS. 20-22). It is desired to deposit a ruthenium capping layer 307 over this structure, but nucleation delay presents issues in layer consistency, particularly in areas where differing materials are exposed. To reduce nucleation delay, a thin glue layer 309 is deposited over the substrate, and the ruthenium capping layer 307 is deposited over this glue layer; the glue layer once fabricated will typically be only a few Angstroms in thickness (e.g., <5-10 Angstroms) and will feature precursor metal and oxygen, as well as trace amounts of precursor by products (such as carbon and nitrogen). For example, in FIG. 3, the glue layer may be a chemical composition of titanium, oxygen, nitrogen and carbon (assuming a titanium precursor is used). As a base electrode 305 is used in the example of FIG. 4, the Ruthenium layer can be made quite thin, serving only as a capping or flash layer and, above the capping layer, a metal oxide layer 311 may then be deposited to serve as a dielectric layer. To minimize the complexity of FIG. 3, a second (top) electrode is not shown, but if desired, such an electrode may be deposited (fabricated from different or the same materials as the first electrode). In one embodiment, a ruthenium-based capping layer is less than about fifty Angstroms in thickness and can be made less than twenty Angstroms in thickness; in another embodiment, an electrode base layer such as titanium nitride is used, it is made to be at least as thick as the ruthenium-based capping layer. As mentioned, in yet another embodiment, the electrode base layer may be several times as thick (e.g., four to five times as thick) as the ruthenium-based material layer. In yet another embodiment, the titanium-based glue layer is no more than ten Angstroms in thickness and usually less than 1-5 Angstroms in thickness (the glue layer 309 is illustrated in FIG. 3 by as a heavy line, due to its thin scale).

Figure 4:
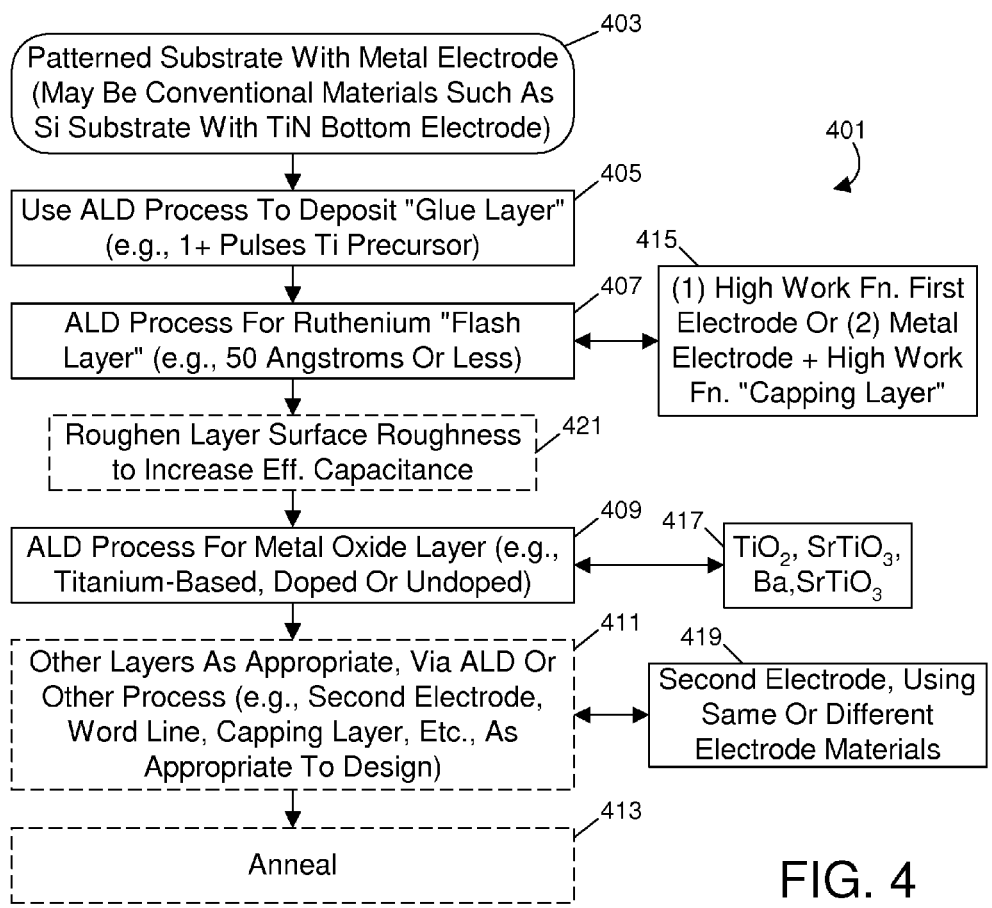

FIG. 4 presents a flow chart 401 of a more specific method of fabricating a semiconductor stack. In FIG. 4, dashed line boxes represent optional steps that may be used depending on desired end product.

More particularly, the method begins per block 403 with a patterned substrate, such as a silicon substrate patterned with a TiN layer that will serve as an electrode base layer for a bottom electrode for a number of capacitors. Because it is desired to use a ruthenium layer for its desirable work function and lattice properties, an ALD process is used to deposit a glue layer using titanium precursor; as indicated in process box 405, one or more precursor pulses may be used for this purpose, separated by purge and oxygen source pulses if desired for the particular application. In at least one embodiment, oxygen source pulses are not used, i.e., the precursor is used to directly interface substrate (and any electrode base layer, if present) with ruthenium-based material. The result of this process is a very thin titanium-based glue layer, built up over any desired target area for deposition of the ruthenium-based material. A ruthenium-based "flash" or "capping" layer may then be deposited, ideally to 20-50 Angstroms or less, as indicated by box 407. It was previously mentioned that the use of a "less expensive" base metal may be used for the electrode, which offers the advantage that the ruthenium layer may be kept thin and then deposited only in the areas where a capacitor is to be formed (e.g., used only for the bottom electrode of each capacitor in a DRAM array, and not used for bitline or wordline routing between cells). As introduced previously, an ALD process may then be used to deposit a titanium oxide metal layer (doped or undoped), and other layers may then be deposited as appropriate (i.e., such as a second electrode layer and any desired encapsulation layer). These steps are respectively indicated by blocks 409 and 411 in FIG. 4. Finally, per numeral 413, an anneal process may then be used to further enhance dielectric constant. As will be revisited below, the anneal may be performed in an oxidizing environment (e.g., RTO) at a temperature of 400-525 degrees Centigrade—a temperature higher than about 525 degrees Centrigrade causes interdiffusion of the ruthenium into the titanium oxide layer, leading to significant increase in leakage.

FIG. 4 also indicates a number of other process variants. For example, as indicated at the right-hand side of FIG. 4 via box 415, ruthenium may be used for the first electrode, or just as a capping layer. In addition, the metal oxide deposited in step 409 can be a doped or undoped oxide, and can include any oxide where a base metal of titanium is used, including without limitation strontium titanate ($SrTiO_3$) and barium strontium titanate ($BaSrTiO_3$), per box 417. Box 419 indicates that if the design calls for use of a second electrode, that electrode can be made of any materials, e.g., it may be based in TiN, ruthenium, or any other material, such as for example, platinum. In one embodiment, a capacitor made according to these teachings may have two electrodes, each with ruthenium forming at least part of their conductive structure. In a second embodiment, the second electrode can be made to include platinum (yet another high work function metal). In yet a third embodiment, a second electrode can be configured to have neither of the mentioned high work function metals, e.g., it can be made from another conductor. Finally, box 421, seen as an option at the middle-left of FIG. 4, indicates that a roughening process can be used to increase effective dielectric constant of a resultant materials stack. For example, if a rutile-phase titanium oxide (inherent dielectric constant of about 80) is used as the dielectric of a capacitor with given dimensions, by roughening at least one of the electrodes, the effective device dielectric constant may be increased (to wit, the resultant capacitor demonstrates dielectric properties equivalent to having a dielectric material with an inherent dielectric constant greater than rutile-phase titanium oxide). A number of processes may be used to increase surface roughness and, as will be presented further below, in one specifically contemplated embodiment, an ozone scrubbing process may be used to create a RMS average roughness of up to 3 nanometers.

With a semiconductor stack and associated method of fabrication thus introduced, additional detail will now be provided as to specific materials used to create a semiconductor stack having excellent (i.e., very low) leakage characteristics and high EOT.

II. Materials And Process Considerations.

As mentioned, the use of a ruthenium-based material layer helps promote the growth of rutile-phase titanium oxide during a reactive fabrication process (e.g., ALD), thus leading to a generally higher dielectric constant. This relationship is further borne out by FIG. 5, which presents EOT and leakage characteristics for platinum and ruthenium electrode combinations (both high work function materials) for yttrium-doped titanium oxides.

Figure 5:
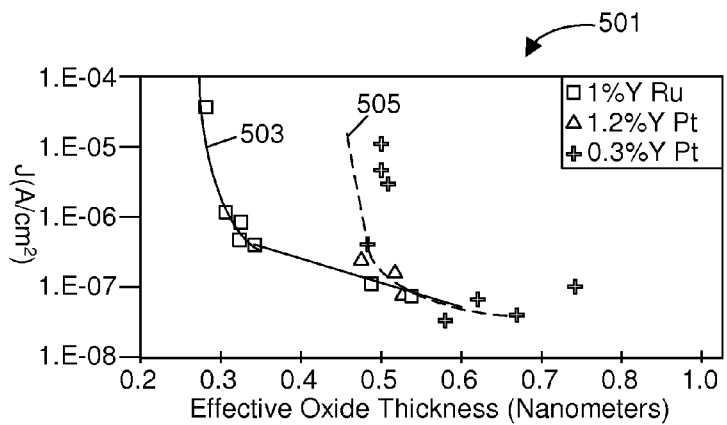

In particular, FIG. 5 shows two trend lines including (1) a solid line 503, associated with ruthenium material as the dielectric growth surface, and (2) a dashed line 505, associated with platinum material as the metal for the dielectric layer growth surface. The solid line 503 generally represents data points identified as squares, representing both top and bottom ruthenium-based interfaces (i.e., with ruthenium material used for each of the top and bottom electrodes). The dashed line 505 generally represents samples (represented as triangles and upright crosses) for platinum-based top and bottom electrode surfaces, respectively having yttrium doping of 1.2% and 0.3% yttrium-to-total-metal. The top electrode interface with the dielectric layer (whether platinum or ruthenium based) is perceived to not have significant impact on EOT, as it is typically added after the dielectric layer has been grown atop the bottom electrode and, thus, it does not influence the growth process. The data in FIG. 5 demonstrates that lower EOT as between platinum- and ruthenium-based interfaces is obtained for ruthenium-based interfaces (solid line 503), again, because it is perceived that lattice matching of ruthenium oxide to titanium oxide engenders the formation of rutile-phase titanium oxide during the growth process. For the platinum-based bottom electrodes, an EOT of less than about 0.5 nanometers was not obtained.

Figure 6:
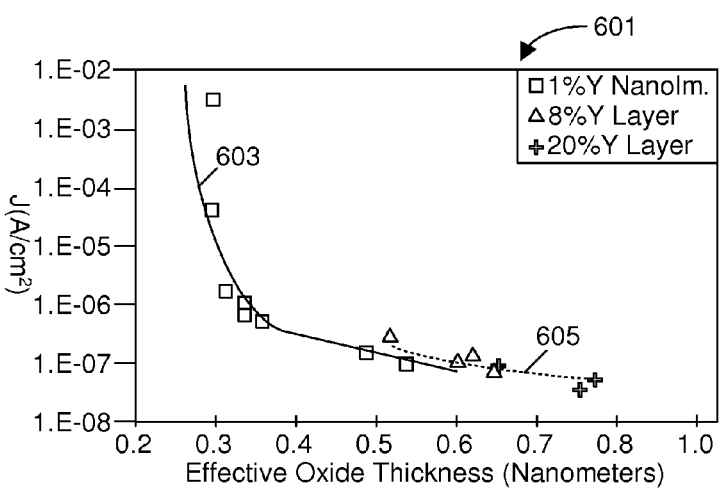

FIG. 6 provides additional data showing how doping processes affect EOT. In particular, FIG. 6 provides a graph 601 having a solid trend line 603, representing use of ALD for yttrium doping (1% yttrium-to-total-metal), and a dotted trend line 605, representing use of sputtering or another process to deposit distinct yttrium oxide monolayers (data represented as triangles, representing a yttrium-to-total metal doping of 8%, and crosses, representing a yttrium-to-total metal doping of 20%). As indicated in the FIG., the use of an ALD process and yttrium doping on the order of 1% yttrium-to-total metal was found to produce excellent results. Other dopant materials that may also produce similar results include aluminum, scandium and other, similar materials, and their oxides.

Thus, as demonstrated in the FIGS. just discussed, the use of ruthenium as a growth substrate for the dielectric layer produces desirable EOT properties, especially for titanium oxide. The use of a suitable dopant (e.g., yttrium oxide or aluminum oxide) may further enhance these properties. As alluded to earlier, however, the deposition or ruthenium presents issues both of cost and of nucleation delay.

Figure 7:
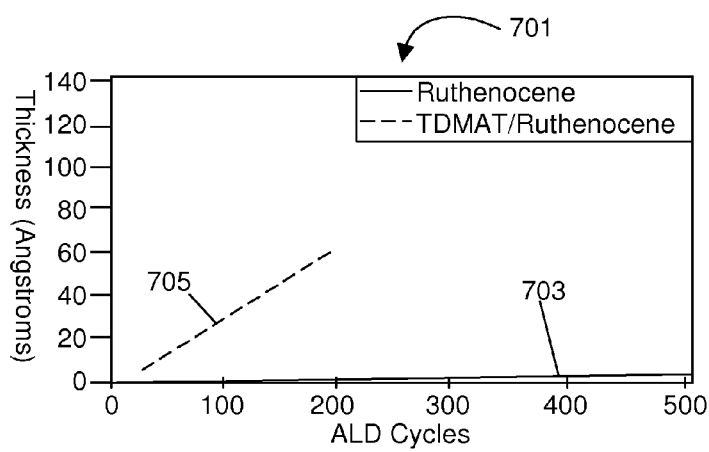

FIG. 7 presents a graph 701 of data on deposition rates for ruthenium. In particular, a first, solid line 703 represents deposition rate of ruthenium on a silicon growth medium (e.g., a silicon substrate); the data shows effectively a deposition rate of "zero" for up to 500 ALD cycles for ruthenocene as the ruthenium precursor. By contrast, a dashed line 705 shows that, where a "glue layer" formed via a titanium precursor is deposited prior to ruthenocene use, a deposition rate of approximately 0.33 Angstroms per ALD cycle is observed. The titanium precursor modifies the surface chemistry of the underlying substrate to more readily interact with the ruthenocene. The resulting glue layer, titanium-based in this embodiment, may be on the order of a fraction of an Angstrom to several Angstroms thick. In one embodiment, the metal precursor used to build the "glue layer" is selected to be the same precursor as used for the dielectric (metal oxide) growth; in another embodiment, the glue layer can be a titanium precursor such as an amide-containing titanium precursor, though the invention is not so limited. One or more precursor layers can be used to deposit the glue layer, with or without associated oxidation.

Figure 8:
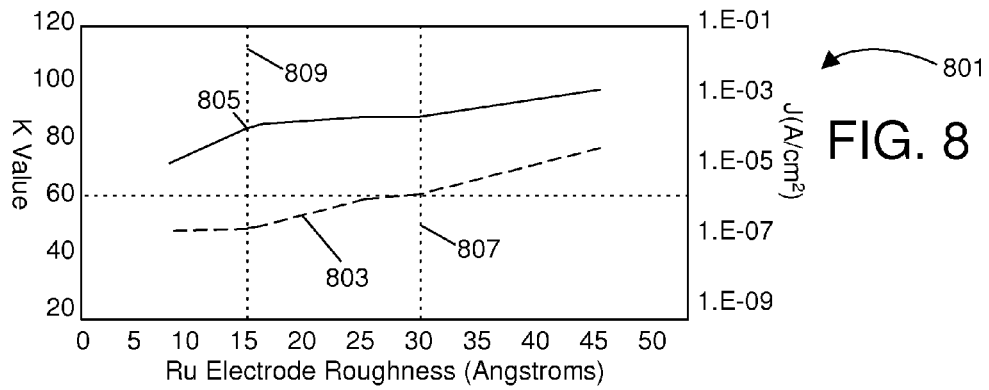

Another process variation used to improve device properties is introduced with reference to FIG. 8, which shows a graph 801 of electrode roughness as influencing both leakage (right axis) and dielectric constant (left axis). In particular, for a capacitor of given width, length and plate separation, effective capacitance can be increased by increasing capacitor plate surface area; by increasing surface roughness of one or both of the capacitor plates, which effectively increases the surface area of the electrode, additional effective dielectric constant of a resultant semiconductor stack can be obtained. In the context of the current embodiments, one way electrode surface roughness can be increased is through the use of an ozone scrubbing or pretreatment process applied to scratch the surface of the ruthenium-based material, that is, subsequent to electrode formation but prior to dielectric layer fabrication.

In FIG. 8, a dashed line 803 represents leakage (Amps per square centimeter, measured at 1 Volt) while a solid line 805 represents dielectric constant for ruthenium-based electrode structures having varying electrode surface roughness; generally speaking, the rougher the electrode surface, the higher the dielectric constant and the higher the leakage. For some designs, it may be desired to maximize dielectric constant up until a point where leakage reaches a level that is unacceptable. In FIG. 8, a vertical range line 807 represents a point where the leakage increases above $10^{-6}$ Amps per square centimeter, at 1.0 Volts. Thus, below this roughness level (RMS median roughness of about 3.0 nanometers), dielectric constant can be maximized for a given set of materials without violating maximum leakage requirements of $10^{-6}$ Amps per square centimeter, at 1 Volt. Clearly, a different median roughness can be used to maximize effective dielectric constant for given varying specification constraints for leakage. To provide another example, leakage in FIG. 8 is seen to not change appreciably for RMS median roughness below approximately 1.5 nanometers, while dielectric constant of 80 or greater was simultaneously observed; thus, it may be desirable for some applications to have a median roughness in the range of 1.5 to 3.0 nanometers, as represented by the range formed between lines 807 and 809.

Figure 9:
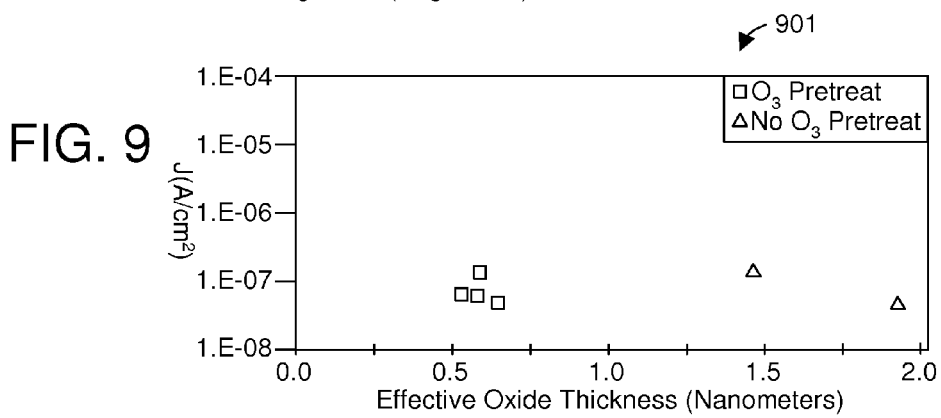

FIG. 9 presents a graph 901 showing data both where ozone pretreatment is and is not used. Data representing ozone pretreated samples is represented in FIG. 9 by squares, while samples not having any pretreatment process are represented by triangles. As seen in this FIG., the pretreatment process has little effect on leakage but significantly affects EOT; an EOT of 1.5-2.0 nanometers was observed for samples with no pretreatment step, whereas the pretreated samples had an EOT of approximately 0.5 nanometers. The primary reason for this difference appears to be the greater effective dielectric constant obtained by virtue of the electrode roughness and formation of rutile $TiO_2$ on oxidized ruthenium.

As to the duration and concentration of an agent used for the pretreatment process (ozone in the example of FIG. 9), it is believed that a source of approximately 10% ozone to oxygen ratio can be used, with an exposure time selected on the order of one to hundreds of seconds, depending on the electrode materials. The specific exposure variables should be selected based on the materials used and other design constraints (such as maximum desired leakage), with the goal being to scratch or displace only some of the exposed ruthenium-based material surface in order to increase its effective surface area. While a scrubbing process that utilizes ozone to remove this material has been described above, it is believed that many processes may be equivalently suited to this process if they increase the RMS variation of the electrode surface in the manner indicated that increases electrode surface area without significantly affecting the ability of that surface to mechanically and electrically interface with the dielectric layer.

The processes discussed above present an effective way to increase effective dielectric constant for given capacitor design, and should present an attractive alternative to using other processes, such as those that rely upon hemispherical polysilicon.

A. Use Of ALD.

Atomic Layer Deposition, or "ALD," refers to a process used to deposit conformal layers with atomic scale thickness during semiconductor processing operations. ALD may be used to deposit barrier layers, adhesion layers, seed layers, dielectric layers, conductive layers, etc. ALD is generally regarded a multi-step, self-limiting process in the sense that a reaction terminates once a transferred material is consumed by the one or more reagents. Generally, a first material (e.g., titanium precursor or oxygen source for deposition of a dielectric layer) is first introduced into a processing chamber and adsorbed to a substrate. Excess material is then purged or pumped away, as appropriate, and then a second material (e.g., oxygen source or titanium precursor) is then introduced into the chamber, to react with the first material. Formation of a complete assembly using the aforementioned steps constitutes one deposition (or ALD cycle), and the process can then be repeated as necessary to form additional monolayers, with the number of cycles (and number of atomic layers) determining the film's total thickness.

In connection with formation of a metal oxide, an ALD cycle can include the introduction of a source of metal as a precursor. This precursor is typically introduced in gaseous form, that is, in a form that readily reacts with oxygen source. Using a Ti precursor such as titanium tetra-isopropoxide (TTIP), or specific other materials, the resultant reaction yields an oxide adhered to the substrate surface and byproducts such as methane, water and potentially other materials, which are pumped away. It is believed that the use of amide-containing titanium precursors (e.g., precursors that have a nitrogen bond) may produce good results when combined with the use of a ruthenium-based material as a substrate for dielectric growth. The use of a "glue layer" (e.g., created using a titanium precursor) and/or a ruthenium layer (e.g., a ruthenium capping layer) may also be fabricated as part of the ALD process, e.g., using titanium precursor for the glue layer, and ruthenocene or another ruthenium precursor for the ruthenium layer. As mentioned previously, due to the general high cost of ruthenium precursor materials, it may be desired to use ruthenium for a flash or capping layer for another, relatively inexpensive electrode material, such as titanium nitride (TiN), as an electrode base layer.

Figure 10:
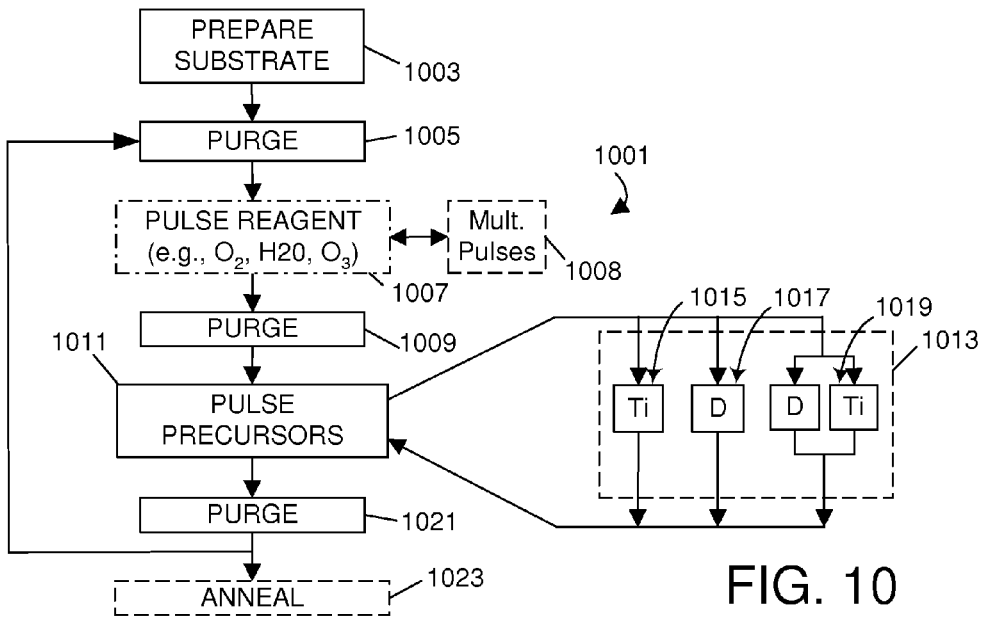

FIG. 10 illustrates this general method, denoted by reference numeral 1001. As indicated by block 1003, a substrate may first be prepared and introduced into a clean room environment. The preparation steps may be any steps suitable to the substrate and other materials at issue, for example, as may be necessary to prepare for deposit of a first electrode on a substrate (e.g., via a wet or dry cleaning process). The substrate may be any material suitable for use in supporting a semiconductor layer, including metal, glass, some other insulator, or another material, conventional or otherwise; generally speaking, when fabricating a MIM stack for use as an electronic component (e.g., capacitor, DRAM cell), an electrode layer is first deposited. As mentioned above, the preparation may also include a scrubbing step depending on exposed surface, to clean, oxidize and otherwise prepare the electrode surface. Following preparation and pretreatment, air is then purged from the chamber by a vacuum process, as indicated by function block 1005. A reagent (such as oxygen gas, ozone gas, water vapor, or some other oxygen source) may then introduced to the chamber to adsorb to the surface of the substrate, per reference numeral 1007; as alluded to above, the introduction of this reagent may overlap the scrubbing process, i.e., if ozone is used as the pretreatment agent and a vacuum is maintained, it may not be necessary to use further reagent for the first ALD cycle. The use of a reagent is denoted by a dashed line (box) to denote that the reagent need not be used when the ALD cycle is being used to deposit a "glue layer." Further, as mentioned previously, some designs may benefit from the use of multiple reagent pulses, separated if desired by a purge cycle (for example, as has been found to be the case where platinum electrodes are used). This process is also indicated in FIG. 10 as a dashed-line (optional step) block 1008. If necessary, the chamber is then again purged, to leave only a conformal amount of the reagent on the top surface of the substrate, as indicated by block 1009. One or more precursors are then introduced to the chamber to react with the oxygen source (e.g., for an exposure time of from one to ten seconds), as indicated by block 1011.

As seen in the exploded detail at the right side of FIG. 10, several options exist for applying the precursor, as contained within a dashed-line block 1013. For example, if the particular ALD deposition is to include only titanium oxide, a titanium precursor can be applied as one or more sequential pulses of gas, per process 1015. These pulses are typically applied if desired without any intervening purge or intervening introduction of an oxygen source. Alternatively, if the ALD cycle is to be used to deposit a dopant monolayer, as depicted by a second process 1017, a dopant material may be introduced, for example, a yttrium precursor, for the purpose of forming a dopant monolayer. Finally, for some embodiments (as indicated by process 1019), it may be desired to mix both titanium and dopant precursors to form a single monolayer, via a co-injection process that introduces simultaneous or successive pulses of the respective gasses (without intervening oxygen source introduction). Each metal precursor is typically an organometallic, although inorganic substances may also be used. Once the precursor has been transferred, the reaction proceeds to consume the top layer of the deposited reagent, and then stops, with the remaining gasses being evacuated (as indicated by process block 1021).

The cycle's result is a layer having a thickness on the order of a fraction of an Angstrom to several Angstroms. Cycles may be then repeated as necessary to deposit any number of desired layers (e.g., forty times to produce a 2 nm thick dielectric layer for a hypothetical growth rate of 0.5 A/ALD cycle). When the dielectric layer of the appropriate thickness and metal electrode have been formed, the assembly is subjected to an anneal process in an oxygen-rich environment, identified by reference numeral 1023, which further oxidizes the fabricated film to fill remaining oxygen vacancies and reduce defects in the film, as will be described below.

Figure 11:
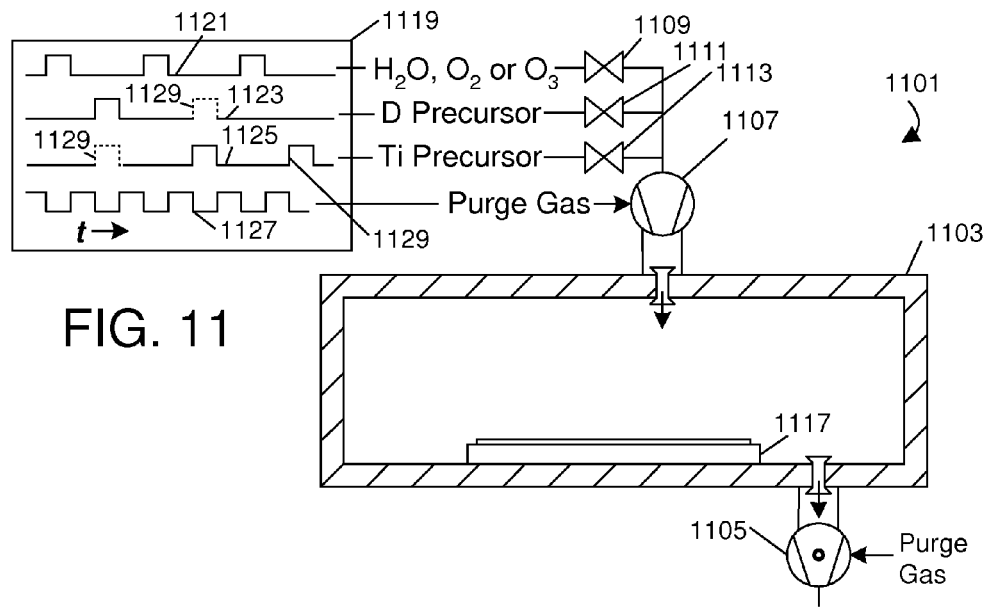

FIG. 11 presents a schematic 1101 of an ALD chamber and an associated timing graph 1119 that may be used to create oxide monolayers of titanium oxide, a dopant oxide or each of them. FIG. 11 shows a reaction chamber 1103 having an evacuation pump 1105 and an inlet 1107, to introduce precursors and reagents into the chamber. Three valves, 1109, 1111 and 1113 are depicted to each respectively supply a reagent (e.g., vaporized water, oxygen or ozone), a dopant precursor or a titanium precursor, as controlled by software. Each gas is selectively introduced into the chamber and forms a self-saturating layer as it flows over the substrate, which may be mounted on a suitable holder or pedestal 1117 and, if desired, may be rotated or otherwise robotically manipulated during deposition or between cycles.

The timing diagram presented at the left-hand side of FIG. 11 shows relative timing pulses that may be used in one embodiment to fabricate oxide layers of titanium and a dopant (i.e., assuming it is desired to create a doped titanium oxide). In particular, a first waveform 1121 represents the timing of reagent pulses, e.g., ozone ($O_3$), oxygen gas ($O_2$), vaporized water, or some other material, as mentioned above. Second and third waveforms, 1123 and 1125, respectively represent the operation of control valves 1111 and 1113 to supply yttrium and titanium precursors (e.g., as organometallics). Finally, a final waveform 1127 represents a digital control over the purge gas functions, used to control both the injection and evacuation pumps (1105 and 1107). The process depicted in FIG. 11 may be used to introduce organometallics deposited together or sequentially without an intervening reagent and/or purge cycle. Solid lines 1123 and 1125 indicate the use of a sequential introduction of organometallics, for example, to deposit distinct layers of $TiO_2$ and a dopant (e.g., $Y_2O_3$, $Al_2O_3$ or another dopant) alternating between these materials to thereby build up an aggregated oxide layer, e.g., via forty or more cycles; alternatively, as indicated by dashed line pulses 1129, injection of organometallics into the deposition chamber may in some embodiments be simultaneous, so as to deposit a number of Ti-D-$O_x$ monolayers. Generally speaking, each monolayer in these embodiments can be expected to be on the order of about ½ Angstrom thick, such that forty layers would produce an oxide layer approximately two nanometers thick. Typical oxide layers can be expected to be at least this thick, with a conventional range being on the order of 10-120 nanometers thickness.

FIG. 11 illustrates that, if desired, a sequence of monolayers may be deposited by introducing a titanium precursor, an oxygen source, a dopant precursor, an oxygen source, a titanium precursor, an oxygen source, and so-on, in a repeating manner, to deposit $TiO_2$ with occasional depositions of a dopant oxide, with intervening purge or other cycles as necessary. As alluded to earlier, dopants such as yttrium oxide, aluminum oxide, strontium oxide or scandium oxide may also be employed, and the ALD process may also be used to deposit the ruthenium-based material layer and glue layer as has been previously described.

Figure 12:
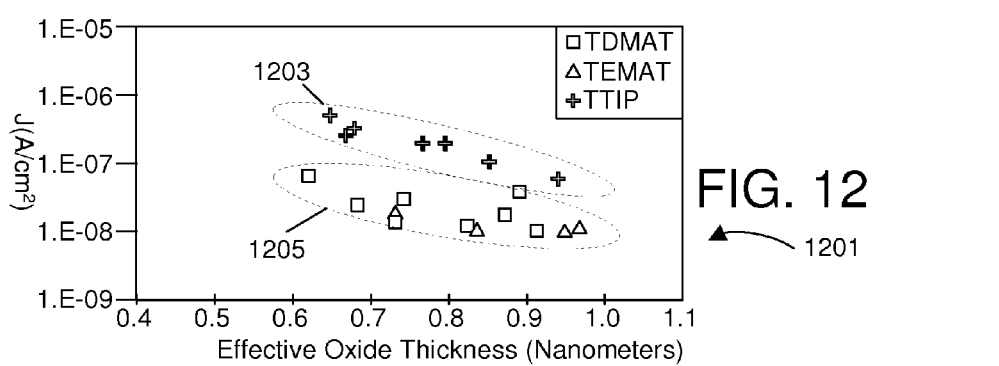

FIG. 12 presents a graph 1201 used to contrast leakage for a titanium oxide dielectric obtained using amide-containing precursors (TDMAT and TEMAT, represented by small squares and triangles, respectively) and TTIP (represented by crosses). In particular, whereas the pretreatment process discussed above seemingly had a profound impact on EOT but not leakage, the use of the amide-containing precursor is seen to have a profound effect on leakage but not necessarily EOT (i.e., with an amide-containing precursor, a range of EOTs is obtained). Two different data sets are encircled in FIG. 12, with a first data set 1203 representing non-amide-containing precursors (e.g., TTIP) and a second data set 1205 collectively representing the amide-containing precursors—as should be apparent, the use of the amide-containing precursors has potential to drop leakage a full order of magnitude below that observed for TTIP—at or near the desired range of $10^{-7}$ A/cm². Thus, the combination of the pretreatment with the use of amide-containing precursors shows potential to help minimize each of EOT and leakage toward the desired goals of EOT <0.7 nm and leakage <$10^{-7}$ A/cm².

Figure 13:
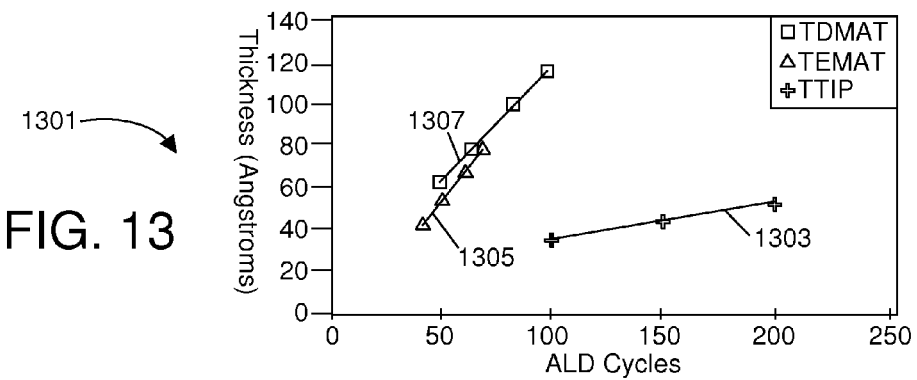

FIG. 13 presents a graph 1301 of deposition rate where TDMAT, TEMAT and TTIP are used as titanium precursors, as a function of ALD cycles. In particular, crosses and a first curve 1303 are used to represent samples obtained using TTIP, triangles and a second curve 1305 are used to represent samples based on TEMAT, and squares and a third curve 1307 are used to represent samples based on TDMAT. Each of the three curves may be modeled as an approximately straight line that intersects with the origin of FIG. 13, with the deposition rate represented by the slope of each line—for TTIP, the first curve 1303 reflects a slope of approximately 0.21 (Angstroms of layer thickness per ALD cycle), while for the TEMAT and TDMAT samples (curves 1305 and 1307, respectively), the slopes are each approximately 1.12 (Angstroms of layer thickness per ALD cycle)—representing a better than five-fold improvement in deposition rate for the amide-containing precursors relative to the non-amide-containing precursor. Generally speaking, higher deposition rates are preferred, ideally at greater than a half Angstrom per ALD cycle and if possible, greater than one Angstrom per ALD cycle.

As will be recalled from the data presented in FIG. 12, the use of amide-containing precursors promotes lower leakage characteristics—FIG. 13 indicates that the use of amide-containing precursors also promote a significantly faster deposition rate, which in turn, implies significantly lower manufacturing cost for semiconductor devices that might rely on the structures proposed by this disclosure.

Figure 14:
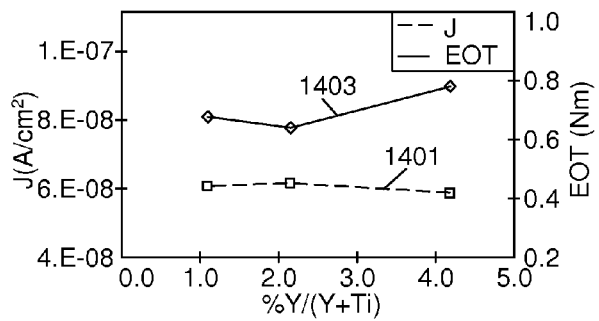

FIG. 14 is a graph that plots both leakage density and effective oxide thickness ("EOT") as a function of yttrium contribution to total metal in embodiments where yttrium oxide is used as a dopant. In particular, FIG. 14 plots leakage density 1401 and EOT 1403 where TDMAT and Y(MeCp)$_3$ are used as the titanium and yttrium precursors, respectively. As with the data presented above, it is generally desired to have both low leakage density and low effective oxide thickness, and the data from FIG. 14 indicates that the referenced materials may be used to produce Y—Ti—O$_x$ films having good leakage density and EOT within a range of approximately one to five percent (for ALD processes). Notably, as contrasted with sputtering processes mentioned in connection with FIG. 6, the ALD process discussed with respect to FIG. 14 provides excellent results for even lower concentrations of yttrium, i.e., for a range of 1-5% yttrium (as contrasted with about 8% or more yttrium for the sputtering process).

Figure 15:
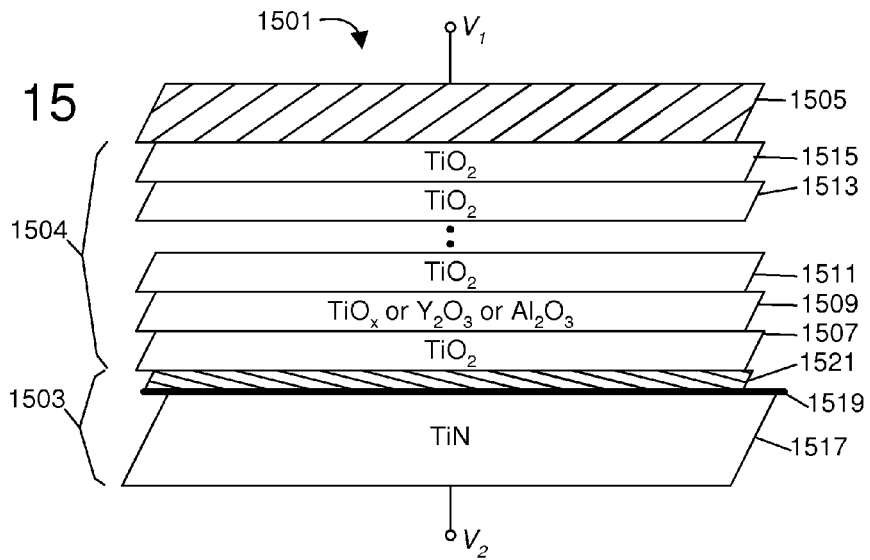

FIG. 15 depicts an embodiment of a capacitive device 1501, namely, one manufactured using an ALD process such as has been discussed earlier. A capacitor may include two conductive layers 1503 and 1505 which together sandwich a dielectric region 1504. To store charge on the device, a voltage potential is applied to each conductive layer 1503 and 1505 via a set of nodes, i.e., as indicated by the two depicted voltages, $V_1$ and $V_2$. The dielectric region, in turn, is seen to include a large number of individual monolayers or layers 1507, 1509, 1511, 1513 and 1515; each layer may be a discrete titanium dioxide (TiO$_2$) monolayer, preferably rutile-phase—if desired, a dopant or co-injected monolayer may be dispersed every x depositions of the primary material (TiO$_2$), as suggested by text associated with monolayer 1509. To provide an example, a dopant of yttrium oxide, aluminum oxide, scandium oxide or strontium oxide may be used in a specific ratio with respect to titanium oxide layers (e.g., ordered as x depositions of TiO$_2$, a dopant deposition, y depositions of TiO$_2$, and so forth). While only five depositions are depicted in FIG. 15, it should be noted that any number can be used and the number chosen depends upon dielectric layer materials and desired thickness of a fabricated device; for example, one embodiment of such a device features a total dielectric thickness in range of 5-10 nm to achieve an appropriate level of capacitance while minimizing leakage. By creating individual, reacted, atomic scale monolayers in this manner, each as part of an ALD "cycle," a dielectric region may be built up to theoretically any desired thickness. As mentioned, a typical thickness per ALD cycle may be on the order of one-half Angstrom so that, for example, one hundred cycles might be used to create a dielectric region having a five nanometer thickness.

Notably, as with all FIGS. in this disclosure, the depicted size and thickness of layers, including relative dimensions, should be read as illustrative only.

The bottom electrode layer 1503 is seen in this embodiment to include a number of constituent layers, including a base electrode layer 1517, a glue layer 1519 and a capping or flash layer 1521. For example, as has been previously discussed, the base layer 1517 can be made of a relatively inexpensive conductor material such as titanium nitride, and the glue layer 1519 can be a titanium material monolayer having by products from the use of a metal precursor. The capping layer 1521 may then include a ruthenium-based material (e.g., ruthenium oxide) deposited so as to serve as a growth substrate for the dielectric layer 1504. The arrangement depicted in FIG. 15 permits the use of ruthenium in a relatively sparing, inexpensive manner but, as alluded to earlier, it is also possible to have the entire electrode 1503 be made of a ruthenium-based material, and also to use deposition processes other than ALD.

Figure 16:
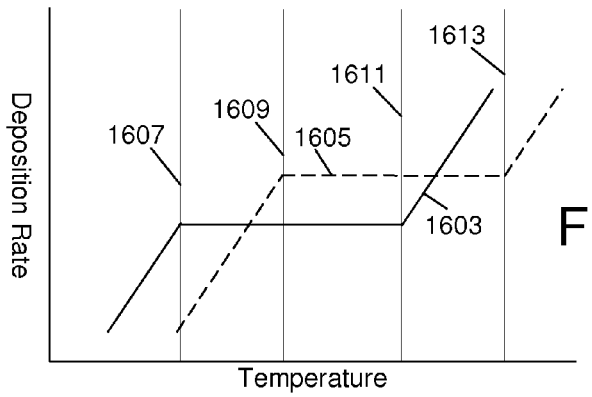

FIG. 16 is a graph 1601 used to introduce temperature windows, and also a problem that can arise when multiple precursors are used in one process (e.g., a dopant precursor and a titanium precursor). The temperature window of a first precursor, e.g., a titanium precursor, is indicated by curve 1603. A steep low temperature slope represents the area below saturation, i.e., where deposition does not proceed satisfactorily, and a steep high temperature slope represents an area where each precursor breaks down, with chemical bond separation of the precursor molecule structure becoming unpredictable (thus significantly affecting deposited dielectric layer quality).

Where multiple specific precursors are used in an interlaced manner (e.g., different titanium precursors or a titanium precursor and dopant precursor), temperature window management can become difficult based on non-overlapping optimal reaction temperatures. For example, if a titanium oxide dielectric layer is doped with a small amount of yttrium oxide, as individual ALD monolayers dispersed within the dielectric layer structure, non-overlapping temperature windows for the different precursors can create heating issues, ultimately increasing overall ALD process time and complexity. Generally speaking, the precursor molecules are significantly more complex than pure metals or metal oxides that might be used in a PVD process; with poor choice of reaction temperature, the wrong molecule bonds might be broken, resulting in impurities in the resultant dielectric layer, and otherwise impeding the fabrication process. Generally speaking, the reaction windows (or ALD process window) for common titanium precursors and common yttrium precursors, respectively, do not substantially overlap, making it difficult to fabricate devices with both titanium and yttrium using an ALD process. To this end, specific selection of precursor combinations may be used to address these problems.

In this regard, FIG. 16 also graphs a possible temperature window for a second precursor 1605, such as a yttrium precursor, depicted using a dashed line. Through selection of specific precursors, the process windows (i.e., the horizontal areas) may be caused to overlap, facilitating deposition processes. The transitions from low temperature slopes and to high slopes for each of the precursors, respectively, are identified by reference numerals 1607, 1609, 1611 and 1613. Ideally, precursors are chosen that cause the horizontal portions of these windows to overlap in view of the reagent used for the ALD process and the desired dielectric layer material.

More specifically, the following pairs of precursor materials have been found to have at least partially overlapping ALD process windows:
(a) TTIP and tris(methylcyclopentadienyl)-yttrium (Y(MeCp)$_3$);
(b) TDMAT and tris(methylcyclopentadienyl)-yttrium (Y(MeCp)$_3$);
(c) TEMAT and tris(butylcyclopentadienyl)-yttrium ((BuCp)$_3$)Y;
(d) MeCp-TDMA and tris(methylcyclopentadienyl)-yttrium ((MeCp)$_3$)Y; and
(e) TDEAT and tris(butylcyclopentadienyl)-yttrium ((BuCp)$_3$)Y.

These are not the only specific material combinations possible, but they do represent precursor combinations that should yield appropriate results and facilitate fabrication of superior dielectric layers as part of an ALD process. Importantly, deposition rates associated with these materials may vary within the listed temperature ranges; therefore, in one detailed embodiment, the precise temperature within the common process window may be varied, to provide different relative deposition rates for the listed materials. If desired, appropriate choice of a ruthenium precursor may permit the fabrication of a titanium glue layer, a ruthenium-based layer, a titanium oxide layer, and appropriate doping materials all within a single common process window. If desired, specific materials or layer arrangements may be selected with process window in mind, so as to streamline the fabrication process. Other variations may include controlling the volume and/or rate of precursor or reagent supply.

Figure 17:
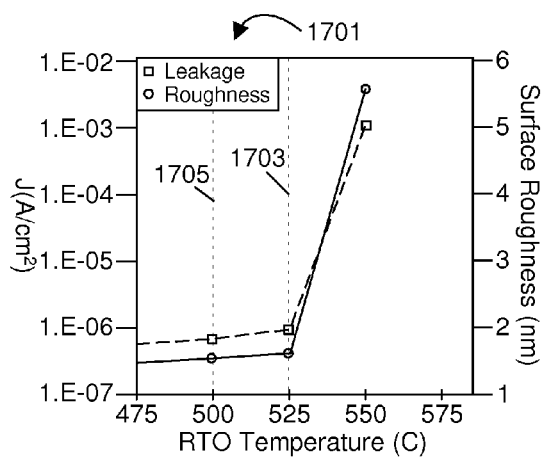

FIG. 17 charts correlation of leakage and roughness as a function of anneal temperature (with samples based on a ruthenium bottom electrode). An anneal process in an oxygen environment (e.g., RTO, or rapid thermal oxidation, or a furnace anneal) may help fill oxygen vacancies (defects) and eliminate interface states (open molecular bonds at the interface of a layer) thus promoting lower leakage characteristics. However, at too high a temperature, especially for ruthenium, the anneal process can cause interdiffusion of the ruthenium layer with other layers and thus give rise to significant leakage. In FIG. 17, a graph 1701 shows squares for leakage and circles to represent effects on surface roughness. As the anneal temperature increases too much (above 525 C for the ruthenium materials that are the subject of FIG. 17), surface roughness becomes disrupted, and leakage spikes strongly. Thus, it is believed that as high a temperature as possible should be used for the anneal process, but not at a temperature high enough to damage the device being manufactured or otherwise denigrate EOT or K-value. For MIM stacks based on a ruthenium bottom electrode, such a range may lie at 400-525 C and preferably at 500 C-525 C, as represented by range lines 1703 and 1705 in FIG. 17.

The data presented above supports the use of an ALD process as also providing superior process results for dielectric layer fabrication, particularly for oxides of yttrium and titanium and their various combinations. As further indicated by the data, the use of ruthenium as providing a growth surface for the dielectric layer, and ozone as a pretreatment agent and reagent in these processes provides further benefits and generally produces a superior dielectric layer.

With ALD processes suitable for manufacturing a superior dielectric layer and MIM structure thus described, other a number of exemplary devices based on such a structure will now be described, including a number of DRAM configurations and an array based on these DRAM devices.

III. Fabrication Of A DRAM Cell And Associated Memory Array.

Figure 19:
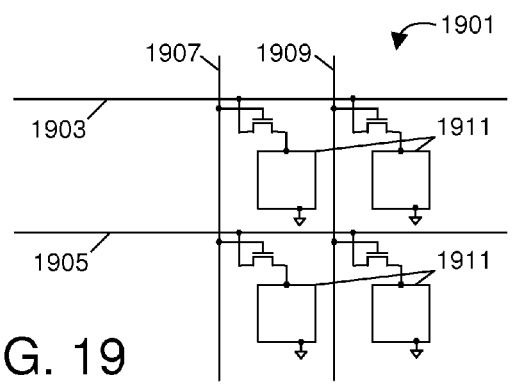
FIG. 19 shows an array of DRAM cells, each cell made using a plurality of monolayers according to the technology presented herein.
Figure 18:
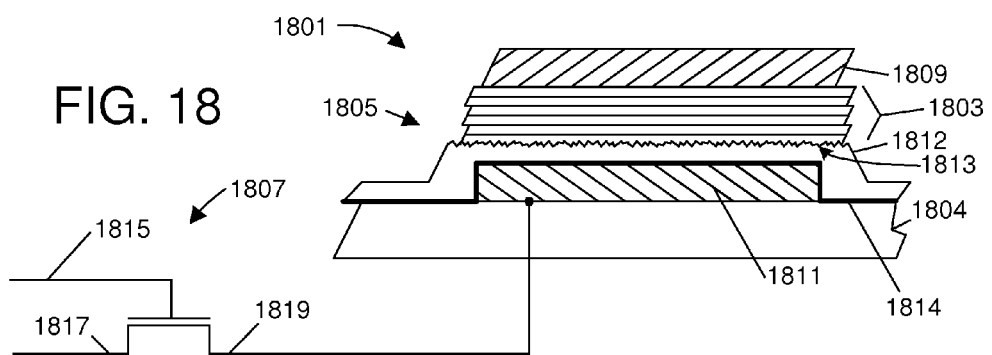
FIG. 18 is a diagram used to illustrate fabrication of a dynamic random access memory ("DRAM") cell according to the principles introduced herein.

As mentioned above, two specific applications of the principles discussed herein are to the fabrication of capacitors and to the fabrication of memory cells, including dynamic random access memory ("DRAM") cells (which form the basis for volatile memory in most contemporary computer systems). FIGS. 18 and 19 will be used for this initial discussion. DRAM memory cells use a capacitor to store charge for a period of time, with the charge being electronically "read" to determine whether a logical "one" or "zero" has been stored in the associated cell. Conventionally, a cell transistor is used to access the cell, i.e., the cell transistor is turned "on" in order to store data on each associated capacitor and is otherwise turned "off" to isolate the capacitor and preserve its charge. More complex DRAM cell structures exist, but this basic DRAM structure will be introduced below, for purposes of illustrating the application of the principles of this disclosure to capacitor manufacturing and to DRAM manufacturing. Following this introduction, several specific structures will be described, with reference to FIGS. 20-22.

FIG. 18 is used to illustrate one DRAM cell 1801, namely, one built using one or more monolayers that collectively form an oxide layer, e.g., as a capacitor dielectric layer 1803. The cell 1801 is depicted to schematically include two principal components, including a cell capacitor 1805 and the cell transistor 1807 (seen at the left-hand side of FIG. 18). The cell transistor is usually constituted by a MOS transistor having gate, source and drain, the gate being connected to a word line and one of the source and drain being connected to a bit line. The cell capacitor has a lower or storage electrode and an upper or plate electrode, the storage electrode being connected to the other of the source and drain of the cell transistor and the plate electrode being connected to a reference potential wiring. The cell transistor is, when selected, turned "on" by an active level of the word line to read or write data from or into the cell capacitor via the bit line. The memory cell according to each of embodiments described herein includes a cell capacitor that includes an insulating layer (e.g., a dielectric) between two metal electrodes (storage and plate electrodes).

As was introduced earlier, the cell capacitor 1805 may include a number of layers, including two conducting layers 1809 and 1811, one of which is initially deposited or laid upon a substrate 1804, using one of many well-known processes. In the example seen in FIG. 18, the layer 1811 is used to selectively store charge to represent a logic state, i.e., it is normally electrically isolated from other components and is accessed using the cell transistor 1807. The dielectric layer

1803 helps maintain an electric field between this plate and the second conducting layer 1809, which may be connected to ground. As indicated previously, using layers made according to the process teachings explained above helps promote a higher dielectric constant with favorable leakage characteristics, and the cell 1801 depicted in FIG. 18 may therefore be made relatively smaller and be made to have a relatively thin dielectric layer. As with the case with the embodiments described earlier, the layer depictions in FIG. 18 are drawn to explain principles only, and should not be understood to denote relative sizes.

As introduced earlier, the dielectric layers formed between the conductors may be enhanced through lattice matching through the use of a ruthenium-based material layer, such as a capping layer 1812 which, together with an electrode base layer 1811, forms a bottom electrode. The ruthenium layer may have a top surface which is roughened as indicated by arrow 1813, so as to increase effective dielectric constant by effectively increasing capacitor plate area without increasing overall capacitor dimensions. As mentioned, the structure may also include a titanium-based glue layer 1814, which can be employed so as to reduce nucleation delay associated with the use of the ruthenium layer 1812. The adherence or glue layer advantageously may be coextensive with the target area for the application of ruthenium, such that it interfaces the ruthenium layer 1812 with both portions of exposed substrate 1804 as well as patterned electrode material 1811 or other structures.

The cell transistor 1807 receives two inputs 1815 and 1817 from the left-hand side of FIG. 18, respectively representing column and row selection lines used to access a matrix of DRAM cells (not shown in FIG. 18). In particular, activation of a column select signal (on column selection line 1815) causes the transistor to conduct, and to electrically couple the row selection line 1817 with a drain terminal 1819 of the cell transistor, to connect the row selection line to the second conducting layer 1811 of the cell capacitor. As is known, the row line may be coupled to this conducting layer either to provide charge for storage purposes, or to "sense" the stored value of the capacitor. As is typical with DRAM devices, the cell capacitor retains charge only for a short amount of time and refresh procedures may be used if it is desired to retain charge for any significant period.

DRAM technology is relatively cheap to manufacture and usually allows a significant density to be achieved, which are primary reasons why DRAM technology is so commonly used in contemporaneous computer and other digital systems. By enabling a greater dielectric constant to be achieved, and thinner dielectric layers to be used, the principles provided by this disclosure facilitate even smaller and cheaper memory cells.

FIG. 19 illustrates a memory array 1901 formed of DRAM cells, where each cell may be (for example) identical to the cell 1801 presented in FIG. 18. While only four such cells 1911 are illustrated in FIG. 19, it should be understood that a great many cells would typically be presented on a memory device, e.g., millions. Each memory cell 1911 is accessed by a particular combination of row selection line (1903 or 1905) with column selection line (1907 and 1909); while only four address lines have been presented in FIG. 19, a great many more will typically be presented (e.g., 64 columns for memory devices that utilize a 64-bit wide parallel data bus, and a much larger number of row selection lines).

FIGS. 20-22 respectively illustrate memory cells 2001, 2101 and 2201, each illustrating different capacitor configurations. Each memory cell 2001, 2101 and 2201 is formed on a semiconductor substrate 2005, 2105 or 2205, for example, a silicon substrate. Above this substrate, a source or drain region of a cell transistor (2011, 2111 or 2211) is selectively formed. It should be noted that the gate and the other of the source and drain of the cell transistor are omitted in order to avoid the complexity of the drawings. It should be further noted that other memory cells and word and bit lines as well as memory control circuits are also not shown for the same purpose. Each cell capacitor 2021, 2121 or 2221 is formed over the substrate and is connected to the cell transistor region 2007, 2107 or 2207 through a contact plug (2019, 2119 or 2219), formed selectively in an interlayer insulating film 2017, 2117 or 2217 on the substrate. The contact plug may be made of poly-silicon and/or metal such as Tungsten, and the interlayer insulating film may be made of silicon oxide. Each capacitor 2021, 2121 or 2221 is further connected to reference potential wiring 2031, 2131 or 2231. The cell transistor of each of the memory cells is generally the same for FIGS. 20-22 and may be constituted by any one of a planer type, a recess type, a pillar type, a fin type and any other types. However, the configuration of the storage capacitors is different for each of these FIGS.; the memory cell of FIG. 20 includes a cylinder-shaped capacitor 2021, while the memory cells of FIGS. 21-22 are respectively depicted to include a pillar-shaped capacitor 2121 and a crown-shaped capacitor 2221.

FIG. 20 illustrates a memory cell 2001 having a cylinder-shaped capacitor 2021. The capacitor 2021 has cylindrical electrodes 2023 and 2027 surrounding a dielectric layer 2025. The electrodes 2023 and 2027 and dielectric layer 2025 may be formed of the materials described herein using the processes described herein.

As an example of a general process for forming a cylinder-shaped capacitor, an etching stopper film 2022 such as silicon nitride is formed on the interlayer insulating film 2017, followed by another insulating film 2024 such as silicon oxide. The film 2024 is used to determine the height of the cell capacitor 2001. Selective etching is performed on the insulating film 2024 and the stopper film 2022 to form a cylinder hole. The upper surface of the contact plug 2019 is thereby exposed. A conductive layer is then deposited inside of the cylinder hole and on the upper surface of the contact plug 2019, followed by further selective etching, such that the lower or storage electrode 2023 is formed. The electrode may have a surface consisting of an exposed ruthenium-based material as has previously been discussed, and a pretreatment process may then be utilized so as to increase effective capacitive plate area. The dielectric layer 2025 is formed on the storage electrode 2023 and the upper surface of the insulating film 2024. The upper or plate electrode 2027 and the wiring 2031 are thereafter formed to complete the cylinder type cell capacitor. If desired, additional roughening processes can be utilized for the interface between the dielectric layer and the upper electrode, though this is not required.

FIG. 21 illustrates a memory cell 2101 using a pillar- or pedestal-shaped capacitor 2121. The capacitor 2121 includes a pillar-shaped bottom electrode 2123, a dielectric layer 2125, and a top electrode 2127. The dielectric layer 2125 and top or plate electrode 2127 are deposited to conform with the pillar-shaped bottom electrode 2123. As with the capacitor 2021 from FIG. 20, the electrodes 2123 and 2127, and the dielectric layer 2125 may be formed of the materials and/or the processes described herein.

As an example of a general process for forming a pillar-shaped capacitor, a metal pad 2126 such as tungsten is selectively formed to cover the upper surface of the contact plug 2119, followed by an insulating layer (not shown) deposited over the entire surface. Thereafter, a capacitor hole for each memory cell is formed in the insulating layer by selective etching, and a conductive layer is then deposited over the insulating layer to fill each capacitor hole. The CMP (Chemical Mechanical Polishing) method is then performed on the conductive layer thus deposited, so that the pillar electrode 2123 for each memory cell is formed. Here also, the ruthenium and pretreatment processes may be employed as has been previously introduced. After removing the insulating layer, a dielectric layer 2125 is formed on each pillar electrode 2123 and the insulating film 2117, followed by the upper electrode 2127 and the wiring 2131. The pillar type cell capacitor is thus formed.

FIG. 22 illustrates a memory cell 2101 using a crown-shaped capacitor 2221. The capacitor 2221 includes a crown-shaped bottom electrode 2223, a dielectric layer 2225, and a top electrode 2227. The dielectric layer 2225 and the top electrode 2227 conform to the crown shape of the bottom electrode 2223. As with the capacitor 2021 from FIG. 20, the electrodes 2223 and 2227 and the dielectric layer 2225 may be formed of the materials and/or the processes described herein.

The methodology for forming a crown-shaped capacitor may be similar to that depicted in FIG. 20, i.e., a lower or storage electrode for each memory cell can be first formed using etching stopper 2022 and an interlayer insulating film 2024 (see, e.g., FIG. 20). The insulating film is then, however, removed. As depicted in FIG. 22, a dielectric layer 2225 can then be deposited above the lower or storage electrode 2223, to form the crown shape. The upper or plate electrode 2227 and the wiring 2231 are then formed to complete the formation of the crown-shaped cell capacitor.

Although cylinder-, pillar-, and crown-shaped storage capacitors are described above, it is understood that these descriptions are given only as examples, and that the materials and processes described herein can be used to form any style of type of memory storage device.

IV. Conclusion.

What has been described are methods of fabricating a dielectric layer, namely, a stack of one or more layers which can be used as part of a capacitive device, memory device or similar structure. A specific material has been presented for use as a dielectric, enabling smaller and more efficient capacitors, memory devices and other structures to be constructed, characterized by high dielectric constant and excellent leakage characteristics. In addition, specific manufacturing processes have been presented, including the use of processes that use specific titanium sources to create a dielectric layer and devices having improved characteristics; as an example, by using a glue or adherence layer, one may use ruthenium for device manufacture, leading to improved device characteristics. Other applications will readily occur to those having skill in the art in view of the teachings provided above, or in view of the invention defined by the claims set forth below.

In addition, while not specifically claimed in the claim section, the applications reserve the right to include in the claim section at any appropriate time the following methods, systems and apparatuses:

AA. A method of building an electronic device stack having a substrate, a first electrode and a metal oxide layer, comprising:
 forming a titanium-based layer above the substrate, the titanium-based layer having a composition of titanium, oxygen, carbon and nitrogen;
 forming a ruthenium-based material layer above the titanium-based layer, such that the titanium-based layer is between the ruthenium-based material layer and the substrate, the ruthenium-based material layer forming at least part of the first electrode; and
 forming the metal oxide layer to lie above the ruthenium-based material layer.

AB. The method of AA, where forming the metal oxide layer includes using an atomic layer deposition process.

AC. The method of AB, where forming the metal oxide layer includes creating a layer of doped metal oxide characterized by an effective oxide thickness (EOT) of less than one-half nanometer.

AD. The method of AC, where creating the layer of doped metal oxide includes creating a doped titanium oxide, where the dopant includes a metal selected from a group consisting of aluminum, scandium, strontium or yttrium.

AE. The method of AA, where the electrode includes titanium and where the metal oxide layer includes a material selected from the group consisting of titanium oxide, strontium titanate and barium strontium titanate.

AF. The method of AA, further comprising oxidizing at least a surface of the ruthenium-based material layer.

AG. The method of AF, further comprising using a roughening process to increase effective surface area relative to device cross-sectional area for an interface between the metal oxide layer and at least one of the electrodes.

AH. The method of AA, where:
 the first electrode includes an electrode base layer and the ruthenium-based material layer, the ruthenium-based material layer employed as a capping layer;
 forming a titanium-based layer includes depositing titanium precursor above the base layer, the layer in direct contact with each of (a) the base layer and (b) at least some area of the substrate not overlaid with the base layer;
 forming the ruthenium-based material layer includes depositing ruthenium material above the titanium-based layer, in direct contact with the titanium-based layer, such that the titanium-based layer provides an interface with the ruthenium-based material layer and at least (b); and
 forming the metal oxide layer includes forming titanium oxide to lie in direct contact with the ruthenium-based material layer.

AI. The method of AH, where forming the ruthenium-based material layer includes oxidizing at least an exposed surface of a ruthenium material to create a ruthenium-based oxide.

AJ. The method of AI, where forming the metal oxide layer includes building a titanium-based metal oxide using an atomic layer deposition process.

AK. The method of AA, further comprising annealing at least the metal oxide layer and ruthenium-based material layer at a temperature of at least four hundred degrees centigrade.

AL. The method of AK, where annealing is performed in an oxidizing environment and where at least part of the electronic device stack is characterized by a leakage of less than 100 nanoamperes per square centimeter, measured at 1.0 Volts.

AM. The method of AA, where forming the titanium-based layer includes using an atomic layer deposition process to create a titanium-based layer having a thickness of no more than ten Angstroms.

AN. The method of AA, where using an atomic layer deposition process includes using titanium precursor to deposit the titanium-based layer.

BA. An electronic device stack, comprising:
 a substrate;
 a ruthenium-based material layer above the substrate; and
 a metal oxide layer above the ruthenium-based material layer;

an adherence layer to interface ruthenium-based material with at least some portion of the substrate, the adherence layer having a composition of titanium, oxygen, carbon and nitrogen.

BB. The stack of BA, where the adherence layer is formed using a titanium precursor.

BC. The stack of BA, where the ruthenium-based material layer has a thickness of between twenty to fifty Angstroms and the stack further comprises a base layer between the ruthenium-based material layer and the substrate, the base layer being at least as thick as the ruthenium-based material layer.

BD. The stack of BA, where the metal oxide layer includes a primary metal of titanium.

BE. The stack of BD, where the metal oxide layer includes an oxide selected from the group consisting of titanium oxide, strontium titanate and barium strontium titanate.

BF. The stack of BA, where the metal oxide layer is doped with a material including a metal selected from a group consisting of aluminum, scandium, strontium or yttrium.

BG. The stack of BA, where the ruthenium-based material layer forms part of an electrode, the electrode further including an electrode base layer that includes titanium nitride.

BH. The stack of BA, where the metal oxide layer includes a doped titanium oxide and the stack is characterized by an effective oxide thickness (EOT) of less than one-half nanometer.

BI. The stack of BA, characterized by a leakage of less than 100 nanoamperes per square centimeter, measured at 1.0 Volts.

BJ. The stack of BA, where the adherence layer includes titanium and is less than approximately five Angstroms in thickness.

CA. An apparatus, comprising:
a silicon-based substrate;
an electrode base layer above the substrate, forming a pattern such that a plane of a surface of the electrode base layer presents some areas of exposed substrate not overlaid by the electrode base layer;
a ruthenium-based capping layer above the electrode base layer, the ruthenium-based capping layer adhered to the electrode base layer by a process that includes depositing a non-ruthenium metal precursor to adhere the ruthenium-based capping layer to the electrode base layer; and
a metal oxide layer above the capping layer, the metal oxide layer including a primary metal of titanium.

CB. The apparatus of CA, where:
the electrode base layer includes titanium nitride;
the non-ruthenium metal precursor includes a titanium precursor, and the process includes creating a glue layer having a thickness of less than ten Angstroms; and
the metal oxide layer includes a material selected from the group consisting of titanium oxide, strontium titanate and barium strontium titanate.

CC. The apparatus of CB, where the glue layer has a composition of titanium, oxygen, carbon and nitrogen, and where the metal oxide layer includes a dopant having a metal selected from scandium, yttrium, strontium or aluminum, and where the apparatus is characterized by an effective oxide thickness (EOT) of less than one-half nanometer.

DA. An apparatus, comprising:
a substrate;
a first electrode above the substrate;
a second electrode above the first electrode; and
a metal oxide layer between the first and second electrodes;
where
the first electrode includes a ruthenium-based material layer, and
a titanium-based adherence layer is positioned between the ruthenium-based material layer and the substrate, the titanium-based layer having a composition of titanium, oxygen, carbon and nitrogen.

DB. The apparatus of DA, where the substrate includes silicon and the metal oxide includes one of titanium oxide, doped titanium oxide, strontium titanate and barium strontium titanate.

DC. The apparatus of DA, where the ruthenium-based material layer presents a surface that acts as an interface with the metal oxide layer, the surface characterized by an RMS median roughness of between approximately 1.5 to 3.0 nanometers.

DD. The apparatus of DA, where the first electrode includes at least two conductive layers including the ruthenium-based material layer and an electrode base layer having a primary metal other than ruthenium.

DE. The apparatus of DD, where the primary metal is titanium.

DF. The apparatus of DD, where the electrode base layer has a greater thickness than the ruthenium-based material layer.

DG. The apparatus of DF, where the electrode base layer has a thickness that is at least four times a thickness of the ruthenium-based material layer.

DH. The apparatus of DA, embodied as a capacitor.

DI. The apparatus of DA, embodied as a DRAM cell.

DJ. The apparatus of DA, embodied as each one of a plurality of DRAM cells in a memory array.

DK. The apparatus of DA, embodied as one of a cylinder, pillar or crown shaped structure.

DL. The apparatus of DA, where the titanium-based adherence layer includes titanium oxide and is less than approximately five Angstroms thick.

DM. The apparatus of DA, characterized by an effective oxide thickness of less than 0.5 nanometers.

DN. The apparatus of DA, where the ruthenium-based material layer has a thickness of between twenty to fifty Angstroms.

DO. The apparatus of DA, where the first electrode includes an electrode base layer consisting substantially of titanium nitride, and where the ruthenium-based material layer forms an interface for the first electrode and the metal oxide layer.

EA. A memory array, comprising a plurality of memory cells, the array including a substrate, each memory cell including:
a first electrode above the substrate;
a second electrode above the first electrode; and
a metal oxide layer between the first and second electrodes;
where
the first electrode includes a ruthenium-based material layer, and
a titanium-based adherence layer is positioned between the ruthenium-based material layer and the substrate, the titanium-based layer having a composition of titanium, oxygen, carbon and nitrogen and having a thickness of less than ten angstroms.

EB. The memory array of EA, where the ruthenium-based material layer of each memory cell is between approximately twenty to fifty Angstroms thick.

EC. The memory array of EA, where the ruthenium-based material layer has a median surface roughness at an interface with the metal oxide layer of between 1.5 to 3.0 nanometers.

ED. The memory array of EA, where the metal oxide layer includes a titanium-based oxide.

EE. The memory array of ED, where the titanium-based oxide is substantially rutile-phase and each memory cell is characterized as having a capacitor element having effective dielectric constant of greater than 80.

EF. The memory array of ED, where the titanium-based adherence layer includes titanium oxide and is less than approximately ten Angstroms thick.

Accordingly, the foregoing discussion is intended to be illustrative only; other designs, uses, alternatives, modifications and improvements will also occur to those having skill in the art which are nonetheless within the spirit and scope of the present disclosure, which is limited and defined only by the following claims and equivalents thereto.

The invention claimed is:

1. A method of forming an electronic device stack, the method comprising:
   forming a titanium-based layer above a substrate, the titanium-based layer having a composition of at least titanium, oxygen, carbon and nitrogen;
   forming a ruthenium-based material layer above the titanium-based layer, such that the titanium-based layer is between the ruthenium-based material layer and the substrate, the ruthenium-based material layer forming at least part of a first electrode;
   forming a metal oxide layer to lie above the ruthenium-based material layer; and
   forming a second electrode above the metal oxide layer.

2. The method of claim 1, where forming the metal oxide layer includes using an atomic layer deposition process.

3. The method of claim 2, where forming the metal oxide layer includes creating a layer of doped metal oxide characterized by an effective oxide thickness (EOT) of less than one-half nanometer.

4. The method of claim 3, where creating the layer of doped metal oxide includes creating a doped titanium oxide, where the dopant includes a metal selected from a group consisting of aluminum, scandium, strontium and yttrium.

5. The method of claim 1, where the second electrode includes titanium and where the metal oxide layer includes a compound selected from the group consisting of titanium oxide, strontium titanate and barium strontium titanate.

6. The method of claim 1, further comprising oxidizing at least a surface of the ruthenium-based material layer.

7. The method of claim 6, further comprising using a roughening process to increase effective surface area relative to device cross-sectional area for an interface between the metal oxide layer and at least one of the electrodes.

8. The method of claim 1, where:
   the first electrode includes an electrode base layer and the ruthenium-based material layer, the ruthenium-based material layer employed as a capping layer;
   forming the titanium-based layer includes depositing titanium precursor above the base layer, the titanium-based layer in direct contact with each of (a) the base layer and (b) at least some area of the substrate not overlaid with the electrode base layer;
   forming the ruthenium-based material layer includes depositing ruthenium material above the titanium-based layer, in direct contact with the titanium-based layer, such that the titanium-based layer provides an interface with the ruthenium-based material layer and at least (b); and
   forming the metal oxide layer includes forming titanium oxide to lie in direct contact with the ruthenium-based material layer.

9. The method of claim 8, where forming the ruthenium-based material layer includes oxidizing at least an exposed surface of ruthenium material to create a ruthenium-based oxide.

10. The method of claim 9, where forming the metal oxide layer includes forming a titanium-based metal oxide layer using an atomic layer deposition process.

11. The method of claim 1, further comprising annealing at least the metal oxide layer and ruthenium-based material layer at a temperature of at least four hundred degrees centigrade.

12. The method of claim 11, where annealing is performed in an oxidizing environment and where at least part of the electronic device stack is characterized by a leakage of less than 100 nanoamperes per square centimeter, measured at 1.0 Volts.

13. The method of claim 1, where forming the titanium-based layer includes using an atomic layer deposition process to create a titanium-based glue layer having a thickness of no more than ten Angstroms.

14. The method of claim 1 where using an atomic layer deposition process includes using titanium precursor to deposit the titanium-based layer.

* * * * *